(12) United States Patent
Mannebach et al.

(10) Patent No.: US 12,255,137 B2
(45) Date of Patent: Mar. 18, 2025

(54) SIDEWAYS VIAS IN ISOLATION AREAS TO CONTACT INTERIOR LAYERS IN STACKED DEVICES

(71) Applicant: Intel Corporation, Santa Clara, CA (US)

(72) Inventors: Ehren Mannebach, Beaverton, OR (US); Aaron Lilak, Beaverton, OR (US); Hui Jae Yoo, Portland, OR (US); Patrick Morrow, Portland, OR (US); Anh Phan, Beaverton, OR (US); Willy Rachmady, Beaverton, OR (US); Cheng-Ying Huang, Portland, OR (US); Gilbert Dewey, Beaverton, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/419,015

(22) Filed: Jan. 22, 2024

(65) Prior Publication Data

US 2024/0162141 A1 May 16, 2024

Related U.S. Application Data

(62) Division of application No. 16/457,669, filed on Jun. 28, 2019, now Pat. No. 11,942,416.

(51) Int. Cl.
*H01L 23/522* (2006.01)
*H01L 21/8234* (2006.01)
*H01L 25/16* (2023.01)
*H01L 29/06* (2006.01)

(52) U.S. Cl.
CPC .. *H01L 23/5226* (2013.01); *H01L 21/823412* (2013.01); *H01L 21/823425* (2013.01); *H01L 21/823475* (2013.01); *H01L 21/823481* (2013.01); *H01L 25/16* (2013.01); *H01L 29/0653* (2013.01)

(58) Field of Classification Search
None
See application file for complete search history.

(56) References Cited

U.S. PATENT DOCUMENTS

| 10,896,956 | B2 | 1/2021 | Coquand |
| 2013/0037950 | A1* | 2/2013 | Yu ..................... H01L 23/5226 |
| | | | 257/E23.021 |
| 2016/0020305 | A1 | 1/2016 | Obradovic |
| 2017/0047400 | A1 | 2/2017 | Kim |
| 2017/0229555 | A1* | 8/2017 | Balakrishnan ...... H01L 29/7853 |
| 2017/0352662 | A1 | 12/2017 | Xu |
| 2018/0047832 | A1 | 2/2018 | Tapily |

(Continued)

*Primary Examiner* — Khaja Ahmad
(74) *Attorney, Agent, or Firm* — Schwabe, Williamson & Wyatt, P.C.

(57) ABSTRACT

Embodiments disclosed herein include electronic systems with vias that include a horizontal and vertical portion in order to provide interconnects to stacked components, and methods of forming such systems. In an embodiment, an electronic system comprises a board, a package substrate electrically coupled to the board, and a die electrically coupled to the package substrate. In an embodiment the die comprises a stack of components, and a via adjacent to the stack of components, wherein the via comprises a vertical portion and a horizontal portion.

12 Claims, 19 Drawing Sheets

(56) References Cited

U.S. PATENT DOCUMENTS

| 2018/0047932 A1 | 2/2018 | Tapily |
| 2019/0067441 A1 | 2/2019 | Yang |
| 2019/0131395 A1 | 5/2019 | Lee |
| 2020/0091288 A1 | 3/2020 | Lee |
| 2020/0266060 A1 | 8/2020 | Cheng |

* cited by examiner

SIDEWAYS VIAS IN ISOLATION AREAS TO CONTACT INTERIOR LAYERS IN STACKED DEVICES

CROSS-REFERENCE TO RELATED APPLICATIONS

This application is a division of U.S. patent application Ser. No. 16/457,669, filed on Jun. 28, 2019, the entire contents of which is hereby incorporated by reference herein.

TECHNICAL FIELD

Embodiments of the disclosure are in the field of semiconductor structures and processing and, in particular, to vias that include a horizontal portion in order to provide electrical connections to stacked devices and methods of forming such devices.

BACKGROUND

The Pressures to miniaturize electronic devices and improve these devices' performance (e.g., processing power, etc.) has led to increased pressure to reduce sizes of semiconductor devices manufactured in or on a semiconductor die so that more semiconductor devices can fit in or on a semiconductor die. Many techniques have been used to scale semiconductor devices. One technique includes stacking structures in a semiconductor device over each other.

In some architectures, stacked semiconductor devices are electrically coupled together by a common source/drain (S/D) region. Providing electrical connections to the common S/D region in such semiconductor devices can be achieved in different ways. In one scenario, only the top and/or bottom of the common S/D region is electrically coupled to a voltage source. In another scenario, a via is etched through the common S/D region, and the via is then coupled to a voltage source.

There are drawbacks to the techniques of electrically coupling the common S/D regions described above. One drawback is that electrically coupling only the top and/or bottom of the S/D region of a stack leads to different contact resistances for different layers of the stacked semiconductor device. Another drawback is that etching a via in the common S/D region can damage the stacked-channel transistors or lead to loss of strain in the channel.

Another technique that can be used to scale semiconductor devices includes stacking a plurality of components that are electrically isolated from each other. For example, a semiconductor device may comprise multiple transistors that are stacked on each other where each transistor is independently controlled. In order to provide electrical connections to components that are embedded within the stack (i.e., components other than the top component or bottom component) requires the formation of vias in a periphery of the electronic component (e.g., a staircase via architecture similar to those used in 3D NAND devices). Accordingly, significant area penalties are generated when using such architectures.

DESCRIPTION OF THE EMBODIMENTS

Figure 1A:
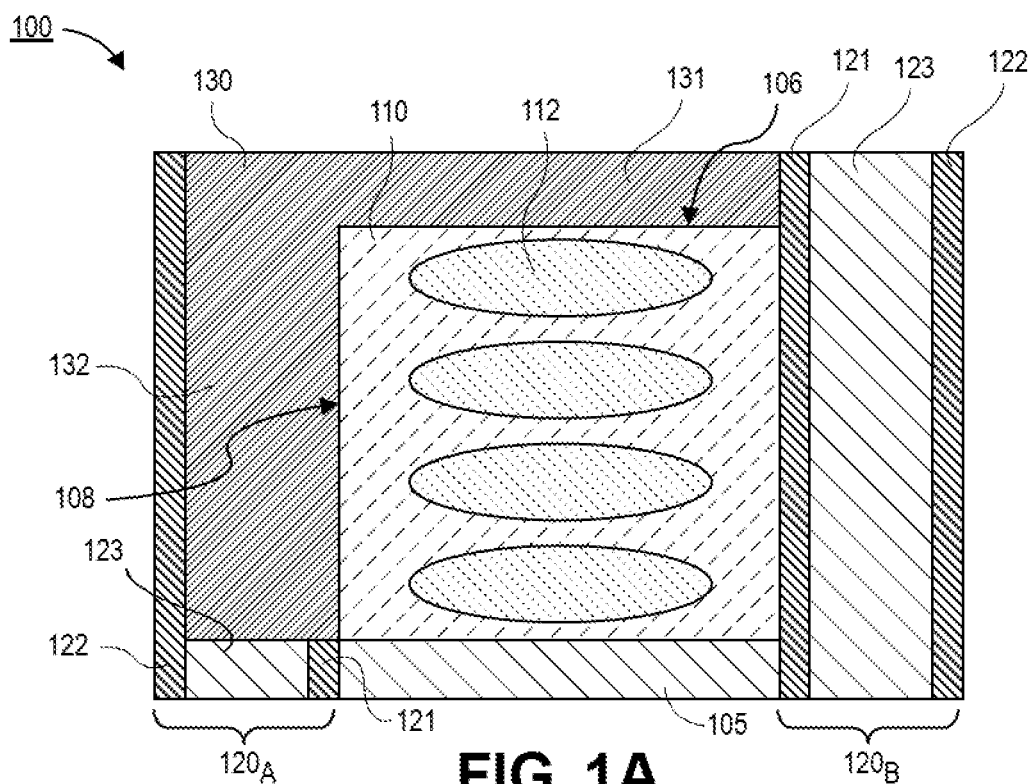
FIG. 1A is a cross-sectional illustration of a semiconductor device comprising a plurality of stacked transistors that are electrically coupled together by a common source/drain (S/D) region and has a contact that extends over a top surface and a first sidewall surface of the common S/D region, in accordance with an embodiment.

Embodiments described herein comprise vias that include a horizontal portion in order to provide electrical connections to stacked devices and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, interconnections for semiconductor devices with stacked architectures are difficult to optimize with respect to contact resistance uniformity and with respect to compact integration. Accordingly, embodiments disclosed herein include interconnect architectures that leverage the use of isolation regions adjacent to the stacked components. For example, contacts and/or vias may be disposed at least partially in the isolation region and provide horizontal connections to components embedded within a stack.

In one embodiment, the semiconductor device comprises a stack of transistors that are electrically coupled together by a common source/drain (S/D) region. In such embodiments, uniform contact resistance is provided by a contact that wraps around sidewall surfaces of the common S/D region. Providing additional interface area between the common S/D region and the contact may also lower the contact resistance of the device. In an embodiment, one or more contacts may be used to interface one or more of a top surface, a bottom surface, a first sidewall surface, a second sidewall surface, and an end surface of the common S/D region.

In another embodiment, the semiconductor device comprises a stack of components that are electrically isolated from each other. In such embodiments, electrical connections to components embedded in the stack are made by a via that passes through a neighboring isolation region. The via may comprise a vertical portion and a horizontal portion that passes through a sidewall of the isolation region to contact one or more components. Accordingly, there is no need for a staircase style interconnect architecture and space on the die is preserved.

Referring now to FIG. 1A, a cross-sectional illustration of a semiconductor device 100 is shown, in accordance with an embodiment. In an embodiment, the semiconductor device 100 may comprise a plurality of stacked transistors. The stacked transistors may each comprise a channel 112 that passes through a gate region (out of plane of FIG. 1A). In the illustrated embodiment, four channels 112 are shown. However, it is to be appreciated that the stack may comprise two or more channels 112. In an embodiment, the channels 112 are stacked directly above one another. In an embodiment, the stack of semiconductor devices may be disposed over an underlying substrate 105. The substrate 105 may be an insulating material (e.g., a shallow trench isolation (STI) layer).

In an embodiment, the channels 112 may comprise a semiconductor material. Suitable semiconductor materials include, but are not limited to, single crystal silicon, polycrystalline silicon, as well as other semiconductor materials including germanium, carbon, or group III-V materials. In an embodiment, the channels 112 may have any suitable dimensions and/or geometries. For example, the channels 112 may comprise nanowires, nanoribbons, fins, or the like.

In an embodiment, a common S/D region 110 may electrically couple the plurality of channels 112 together. The common S/D region 110 (referred to herein as "S/D region" for simplicity), may comprise an epitaxially grown semiconductor material and/or a conductive material. In the illustrated embodiment, the S/D region 110 is shown as surrounding the channels 112. In other embodiments, ends of the channels 112 may be contacted by the S/D region 110. That is, the channels 112 may not pass through the S/D region 110 in all embodiments.

In an embodiment, a first isolation region $120_A$ and a second isolation region $120_B$ are adjacent to the S/D region 110. For example, the S/D region 110 may be positioned between the first isolation region $120_A$ and the second isolation region $120_B$. In an embodiment, each isolation region $120_A/120_B$ may comprise a first wall 121, a second wall 122, and a fill layer 123 between the first wall 121 and the second wall 122. The isolation regions $120_A/120_B$ may be insulative regions that electrically isolate the stacked transistors from neighboring devices (not shown). In an embodiment, the first wall 121 and the second wall 122 may be a first insulative material and the fill layer 123 may be a second insulative material that is etch selective to the first insulative material. For example, the first insulative material and the second insulative material may comprise oxides, nitrides, or oxynitrides.

In the illustrated embodiment, a portion of the first isolation region $120_A$ is filled by a contact 130. In an embodiment, as is also used throughout the present description, contacts 130, vias, interconnect line material (and other conductive structures) are composed of one or more metal or other conductive structures. A common example is the use of copper lines and structures that may or may not include barrier layers between the copper and surrounding materials. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the contacts and vias may be a single material layer, or may be formed from several layers, including conductive liner layers and fill layers. Any suitable deposition process, such as electroplating, chemical vapor deposition or physical vapor deposition, may be used to form contacts 130 or vias. In an embodiment, the contacts 130 are composed of a conductive material such as, but not limited to, Cu, Al, Ti, Zr, Hf, V, Ru, Co, Ni, Pd, Pt, W, Ag, Au or alloys thereof.

The contact 130 may comprise a horizontal portion 131 and a vertical portion 132. In an embodiment, the horizontal portion 131 may be in direct contact with a top surface 106 of the S/D region 110, and the vertical portion 132 may be in direct contact with a first surface 108 of the S/D region 110. Particularly, a portion of the first wall 121 of the first isolation region $120_A$ is removed in order to provide access to the sidewall of the S/D region 110. Accordingly, the contact resistance is reduced compared to an architecture with only a top surface contact. Furthermore, no additional area is occupied by the contact 130 because the first isolation region $120_A$ is already present in the design of the semiconductor device.

Figure 1B:
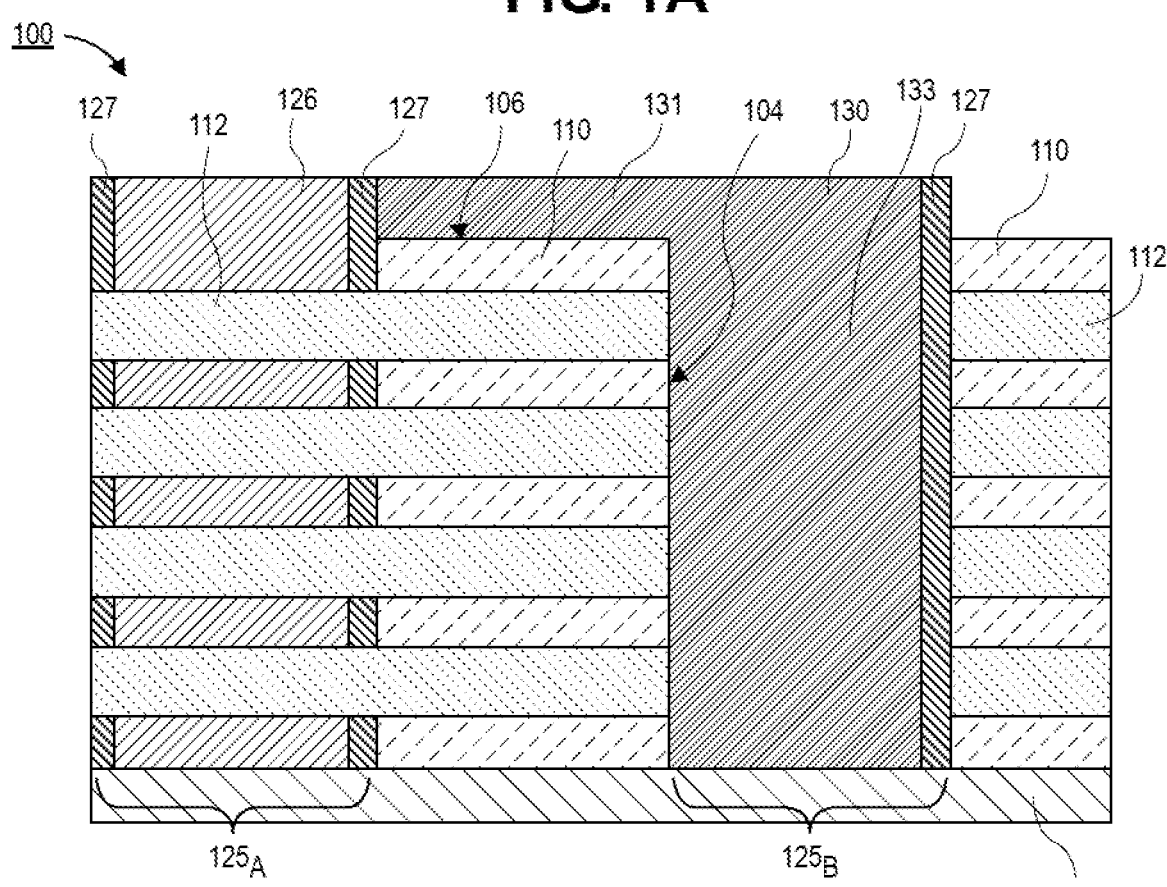
FIG. 1B is a cross-sectional illustration of a semiconductor device comprising a plurality of stacked transistors that are electrically coupled together by a common S/D region and has a contact that extends over a top surface and an end surface of the common S/D region, in accordance with an embodiment.

Referring now to FIG. 1B, a cross-sectional illustration of a semiconductor device 100 is shown, in accordance with an additional embodiment. The cross-sectional illustration in FIG. 1B is shown along the length of the channels 112. In the illustrated perspective, a gate region $125_A$ comprising a gate electrode 126 and gate spacers 127 is shown. A depopulated gate region $125_B$ is also shown adjacent to the S/D region 110. In the illustrated embodiment, the gate dielectric is omitted for simplicity. However, it is to be appreciated that a gate dielectric (e.g., a high-k dielectric material) may separate the gate electrode 126 from the channels 112. In an embodiment, the depopulated gate region $125_B$ may be filled by a portion of a contact 130. Particularly, a vertical portion 133 of the contact 130 fills the depopulated gate region $125_B$. The vertical portion 133 of the contact 130 is in direct contact with an end surface 104 of the S/D region 110.

In some embodiments, the via architectures shown in FIG. 1A and FIG. 1B may be combined to provide a via that contacts a plurality of surfaces of the S/D region 110. That is, the contact 130 may comprise a horizontal portion 131 over a top surface of the S/D region 110, a first vertical portion 132 over a first surface 108 of the S/D region 110, and a second vertical portion 133 over an end surface 104 of the S/D region 110.

Referring now to FIGS. 2A-2H, a series of cross-sectional illustrations depict various contact architectures that include one or more contacts that are positioned at least partially within one or both of the isolation regions. Embodiments allow for such architectures by using front side processing and/or backside processing.

Figure 2A:
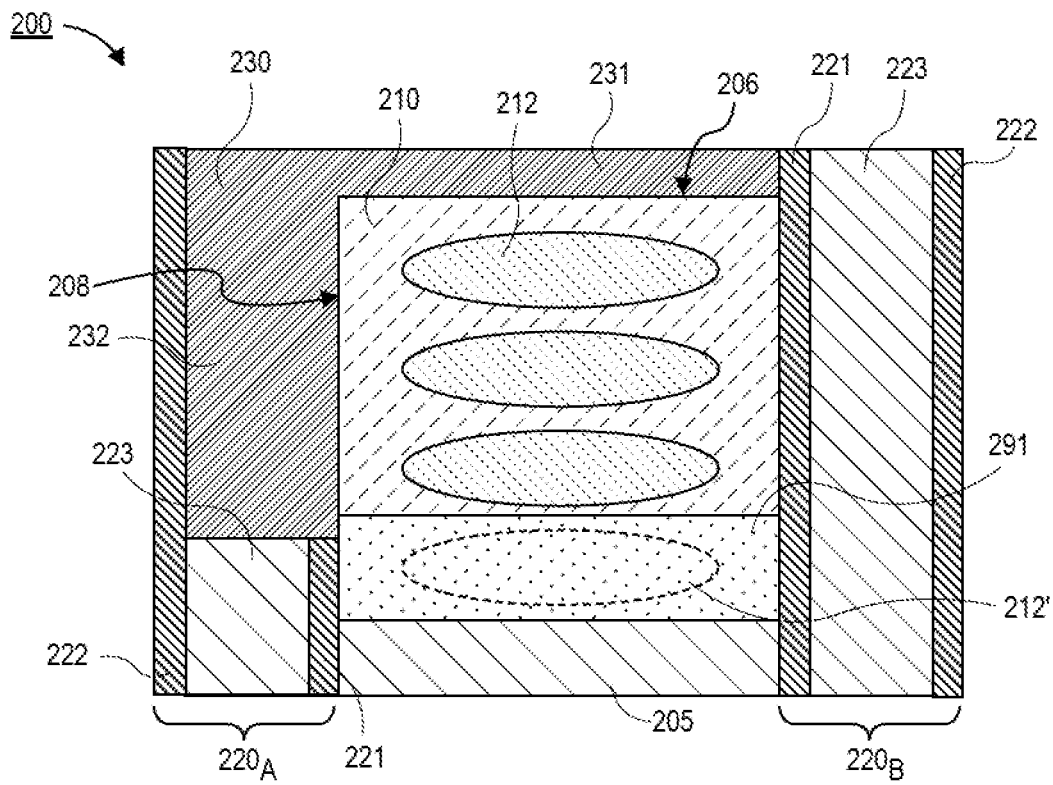
FIG. 2A is a cross-sectional illustration of a semiconductor device comprising a plurality of stacked transistors that are electrically coupled together by a common S/D region with a contact over a top surface and a first surface of the common S/D region.

Referring now to FIG. 2A, a cross-sectional illustration of a semiconductor device 200 is shown, in accordance with an embodiment. In an embodiment, the semiconductor device 200 may comprise a plurality of stacked channels 212 over a substrate 205. The stacked channels 212 may be surrounded by a S/D region 210. In an embodiment, one or more of the stacked channels 212 may be a depopulated channel 212'. A depopulated channel 212' may be a region where the channel 212 is omitted entirely, or where the channel 212 has been surrounded by an insulative layer 291 so that it is a non-functioning transistor layer. In an embodiment, a first isolation region $220_A$ and a second isolation region $220_B$ may be positioned adjacent to opposite surfaces of the S/D region 210. The S/D regions $220_A/220_B$ may comprise a first wall 221, a second wall 222, and a fill layer 223.

In an embodiment, the semiconductor device 200 may comprise a contact 230. The contact 230 may have a horizontal portion 231 and a vertical portion 232. The horizontal portion 231 may be in direct contact with a top surface 206 of the S/D region 210, and the vertical portion 232 may be in direct contact with a first surface 208 of the S/D region 210. For example, the direct contact with the first surface 208 is provided by removing at least a portion of the first wall 221 of the first isolation region $220_A$. In an embodiment, the vertical portion 232 of the contact 230 may extend down past the bottommost channel 212. For example, the vertical portion 232 may end proximate to a top surface of the insulative layer 291 of the depopulated channel 212'.

Figure 2B:
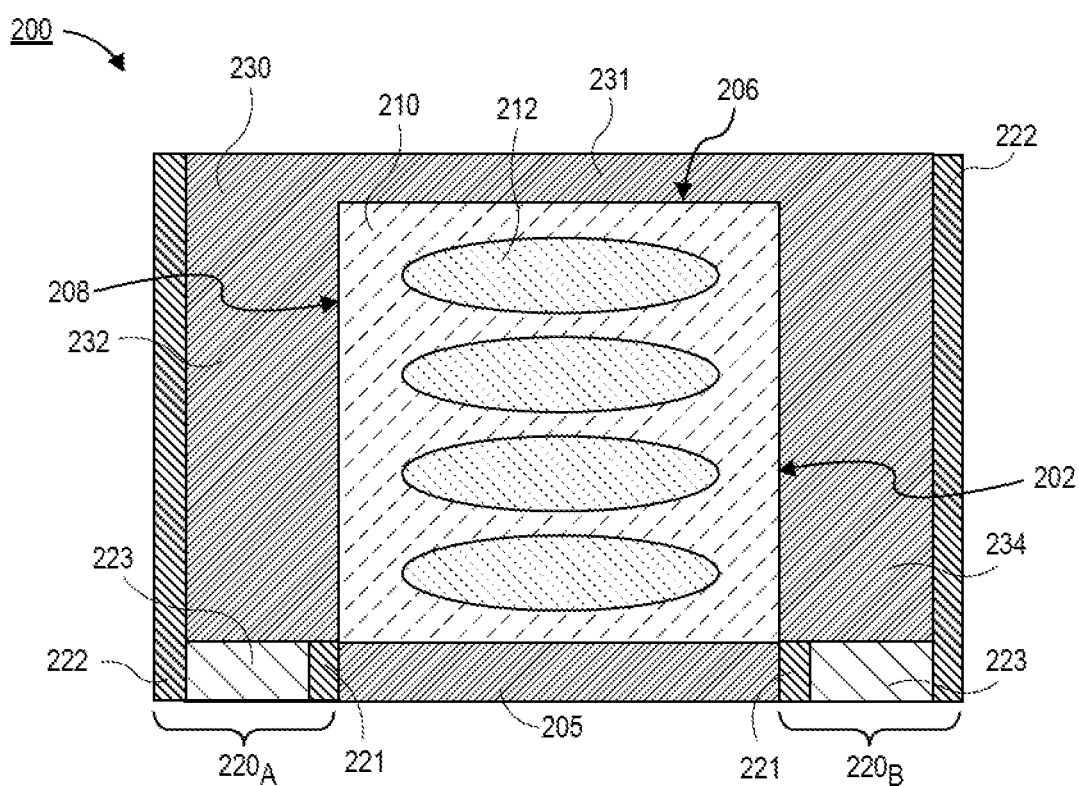
FIG. 2B is a cross-sectional illustration of a semiconductor device comprising a plurality of stacked transistors that are electrically coupled together by a common S/D region with a contact over a top surface, a first surface, and a second surface of the common S/D region.

Referring now to FIG. 2B, a cross-sectional illustration of a semiconductor device 200 is shown, in accordance with an additional embodiment. In an embodiment, the semiconductor device 200 in FIG. 2B may be substantially similar to the semiconductor device 100 in FIG. 1A, with the exception that the contact 230 comprises a first vertical portion 232 that is coupled to a second vertical portion 234 by the horizontal portion 231. In an embodiment, the first vertical portion 232 is positioned in the first isolation region $220_A$ and contacts a first surface 208 of the S/D region 210. In an embodiment, the second vertical portion 234 is positioned in the second isolation region $220_B$ and contacts a second surface 202 of the S/D region 210. That is, at least a portion of the first wall 221 of the first isolation region $220_A$ and at least a portion of the first wall 221 of the second isolation region $220_B$ are removed to provide access to the first surface 208 and the second surface 202 of the S/D region 210. Such an architecture may provide a substantially U-shaped contact 230 that extends around a plurality of surfaces of the S/D region 210.

Figure 2C:
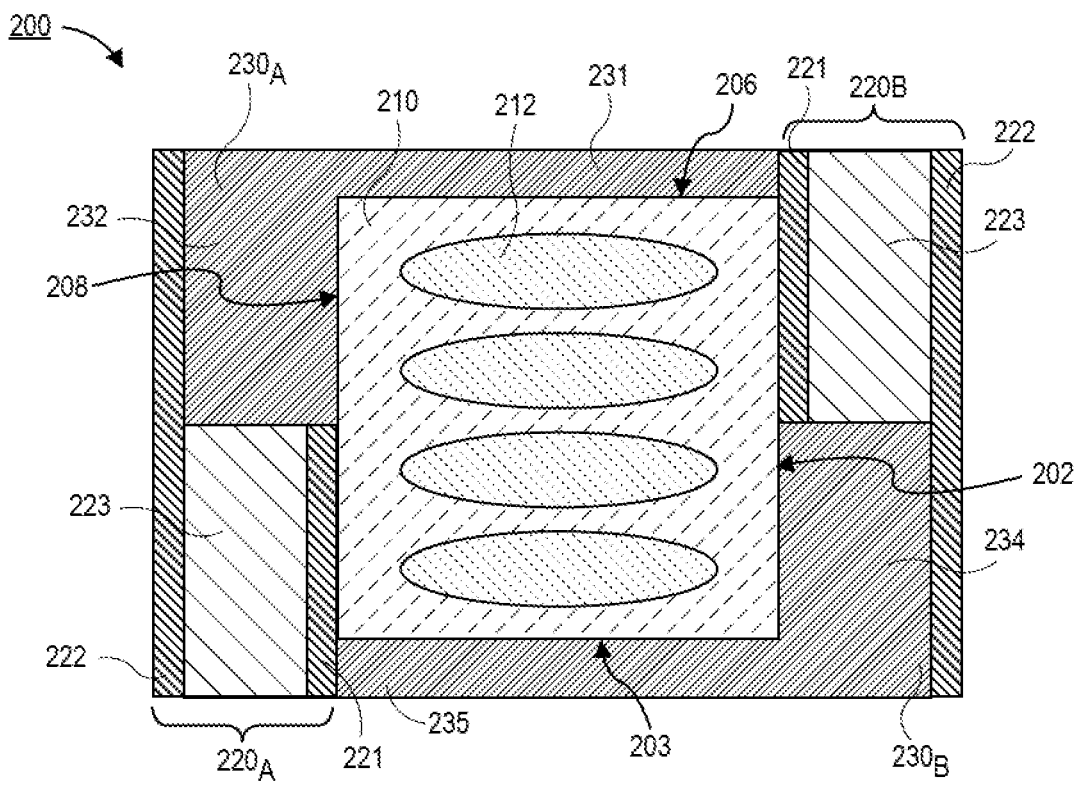
FIG. 2C is a cross-sectional illustration of a semiconductor device comprising a plurality of stacked transistors that are electrically coupled together by a common S/D region with a first contact over a top surface and a first surface of the common S/D region and a second contact over a bottom surface and a second surface of the common S/D region, in accordance with an embodiment.

Referring now to FIG. 2C, a cross-sectional illustration of a semiconductor device 200 is shown, in accordance with an additional embodiment. In an embodiment, the semiconductor device 200 comprises a first contact $230_A$ and a second contact $230_B$. The first contact $230_A$ may be formed with front side processing, and the second contact $230_B$ may be formed with backside processing in some embodiments.

In an embodiment, the first contact $230_A$ comprises a horizontal portion 231 and a vertical portion 232. In an embodiment, the horizontal portion 231 is over a top surface 206 of the S/D region 210 and the vertical portion 232 is over a first surface 208 of the S/D region 210. As shown, the vertical portion 232 may not extend entirely along the first surface 208 of the S/D region 210. That is, a portion of the first wall 221 of the first isolation region $220_A$ may be in contact with the first surface 208 of the S/D region 210.

In an embodiment, the second contact $230_B$ comprises a horizontal portion 235 and a vertical portion 234. In an embodiment, the horizontal portion 235 is over a bottom surface 203 of the S/D region 210 and the vertical portion 234 is over a second surface 202 of the S/D region 210. As shown, the vertical portion 234 may not extend entirely along the second surface 202 of the S/D region 210. That is, a portion of the first wall 221 of the second isolation region $220_B$ may be in contact with the second surface 202 of the S/D region 210.

Figure 2D:
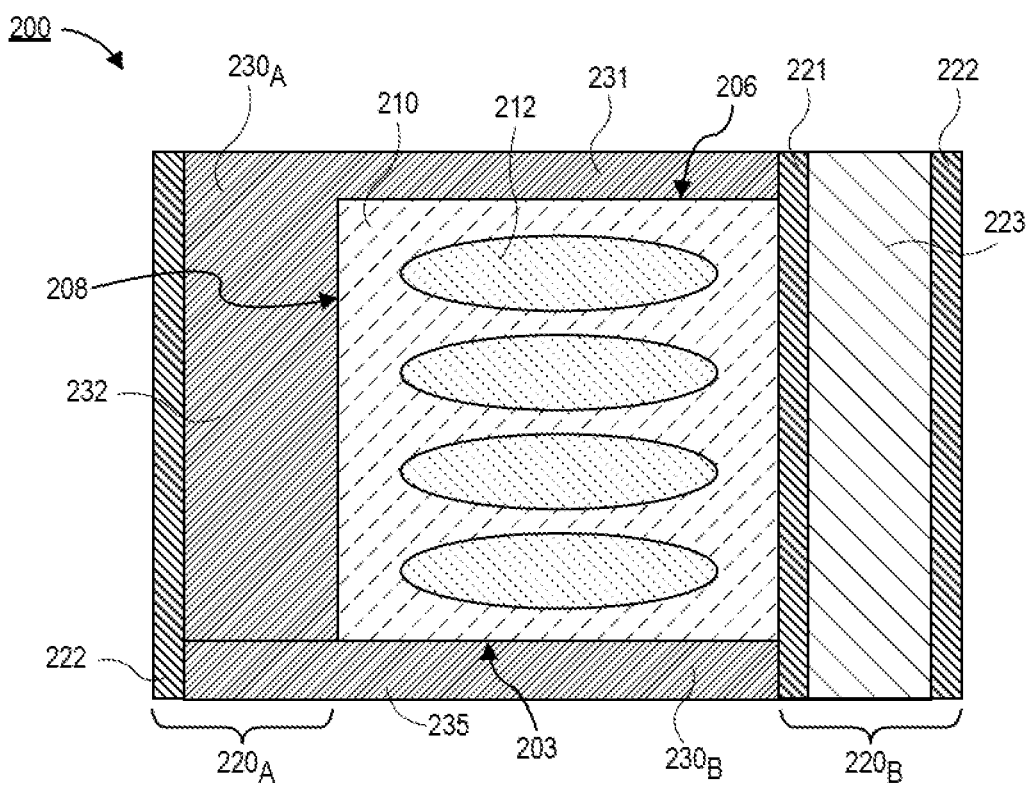
FIG. 2D is a cross-sectional illustration of a semiconductor device comprising a plurality of stacked transistors that are electrically coupled together by a common S/D region with a contact over a top surface, a bottom surface, and a first surface of the common S/D region, in accordance with an embodiment.

Referring now to FIG. 2D, a cross-sectional illustration of a semiconductor device 200 is shown, in accordance with an additional embodiment. The semiconductor device 200 in FIG. 2D may be substantially similar to the semiconductor device 100 in FIG. 1A, with the exception that a second contact $230_B$ is disposed below the S/D region 210. For example, the second contact $230_B$ may comprise only a horizontal portion 235 that is in direct contact with a bottom surface 203 of the S/D region 210. In some embodiments, the first contact $230_A$ and the second contact $230_B$ may directly contact each other, as shown in FIG. 2D. For example, a seam may be present at the interface between the first contact $230_A$ and the second contact $230_B$. This may occur due to the first contact $230_A$ and the second contact $230_B$ being deposited at different times (e.g., during front side processing for the first contact $230_A$ and during back side processing for the second contact $230_B$).

Figure 2E:
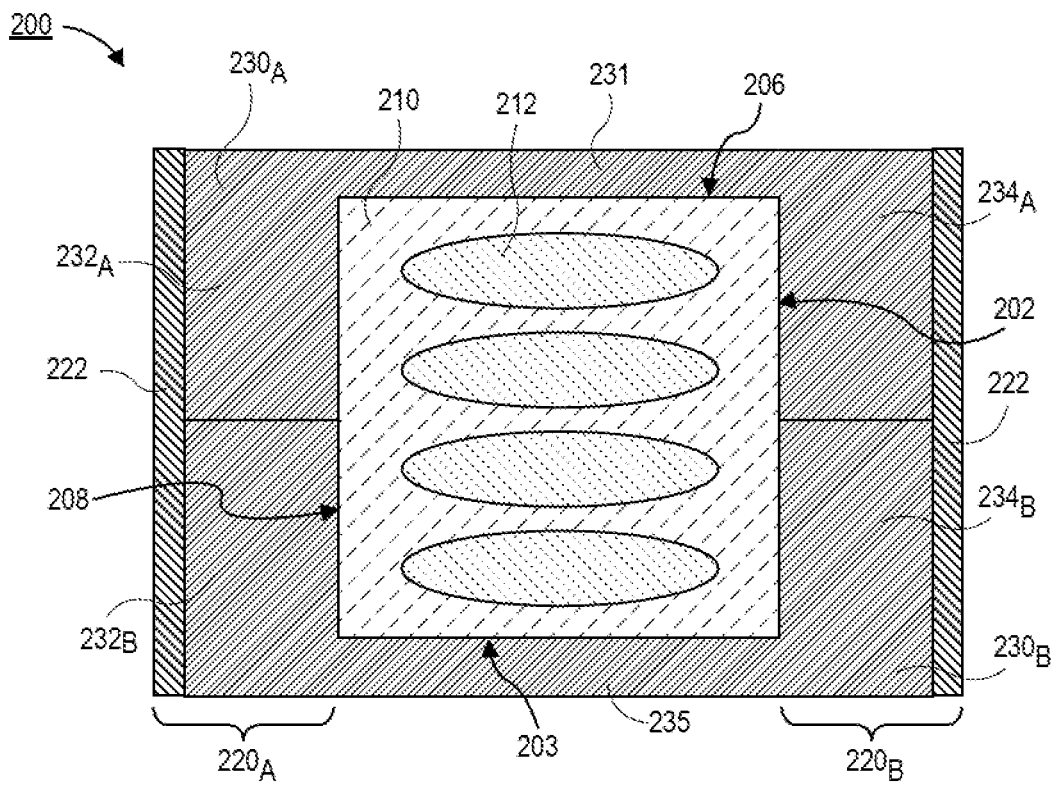
FIG. 2E is a cross-sectional illustration of a semiconductor device comprising a plurality of stacked transistors that are electrically coupled together by a common S/D region with a first contact over a top surface, a first surface, and a second surface of the common S/D region and a second contact over a bottom surface, the first surface, and the second surface of the common S/D region, in accordance with an embodiment.

Referring now to FIG. 2E, a cross-sectional illustration of a semiconductor device 200 is shown, in accordance with an additional embodiment. In an embodiment, the semiconductor device 200 may comprise a first contact $230_A$ and a second contact $230_B$. In an embodiment, the first contact $230_A$ may be formed with front side processing and the second contact $230_B$ may be formed with backside processing. Accordingly, there may be a seam at the interface between the first contact $230_A$ and the second contact $230_B$. Furthermore, the combination of the first contact $230_A$ and the second contact $230_B$ may completely wrap around a perimeter of the S/D region 210. Such an embodiment is possible since the first walls of the first isolation region $220_A$ and the second isolation region $220_B$ are removed. Furthermore, it is to be appreciated that such a configuration also allows for a lower aspect ratio metal fill. That is, the front side processing and the backside processing only need to go halfway across the thickness of the S/D region 210, so the aspect ratios are reduced. Accordingly, metal filling is easier to implement compared to a high aspect ratio configuration.

In an embodiment, the first contact $230_A$ may be substantially U-shaped. That is, the first contact $230_A$ may have a horizontal portion 231, a first vertical portion $232_A$ and a second vertical portion $234_A$. The first contact $230_A$ may be in direct contact with a top surface 206, a portion of the first surface 208, and a portion of the second surface 202 of the S/D region 210. In an embodiment, the first contact $230_A$ may be located in the first isolation region $220_A$ and the second isolation region $220_B$.

In an embodiment, the second contact $230_B$ may be substantially U-shaped. That is, the second contact $230_B$ may have a horizontal portion 235, a first vertical portion $232_B$ and a second vertical portion $234_B$. The second contact $230_B$ may be in direct contact with a bottom surface 203, a portion of the first surface 208, and a portion of the second surface 202 of the S/D region 210. In an embodiment, the second contact $230_B$ may be located in the first isolation region $220_A$ and the second isolation region $220_B$.

Figure 2F:
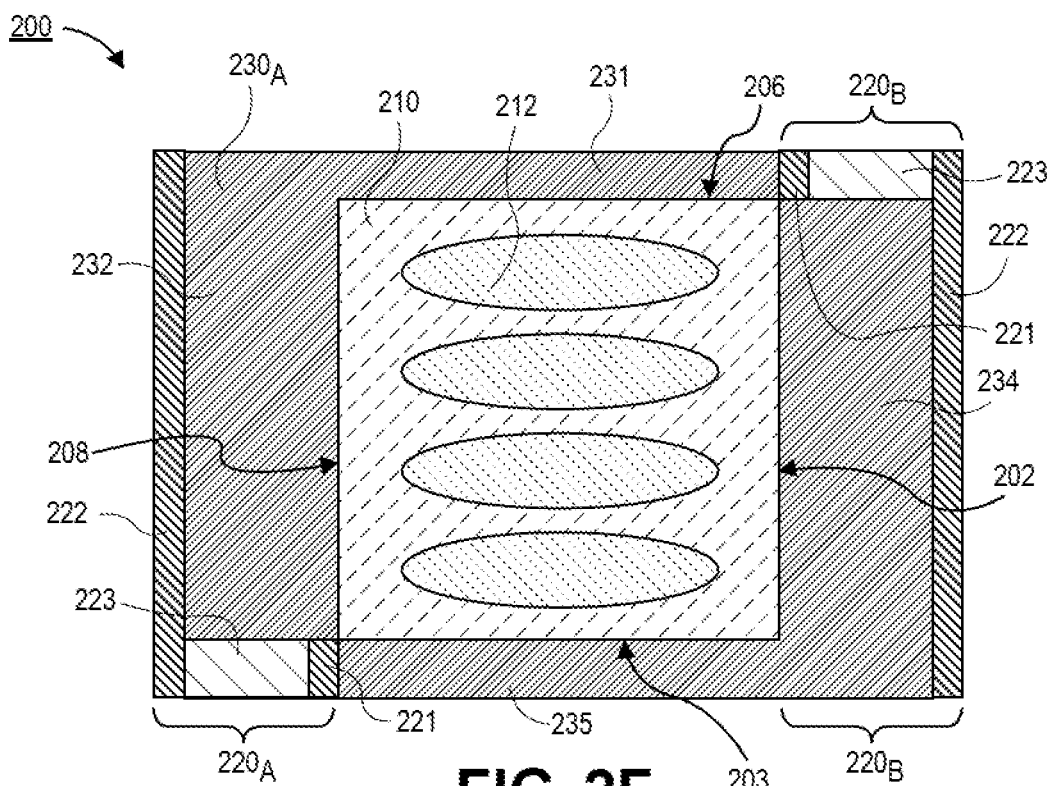
FIG. 2F is a cross-sectional illustration of a semiconductor device comprising a plurality of stacked transistors that are electrically coupled together by a common S/D region with a first contact over a top surface and a first surface of the common S/D region and a second contact over a bottom surface and a second surface of the common S/D region, in accordance with an embodiment.

Referring now to FIG. 2F, a cross-sectional illustration of a semiconductor device 200 is shown, in accordance with an additional embodiment. The semiconductor device 200 in FIG. 2F is substantially similar to the semiconductor device 200 in FIG. 2C, with the exception that the vertical portion 232 of the first contact $230_A$ and the vertical portion 234 of the second contact $230_B$ extend along the entire first surface 208 and the entire second surface 202, respectively.

Figure 2G:
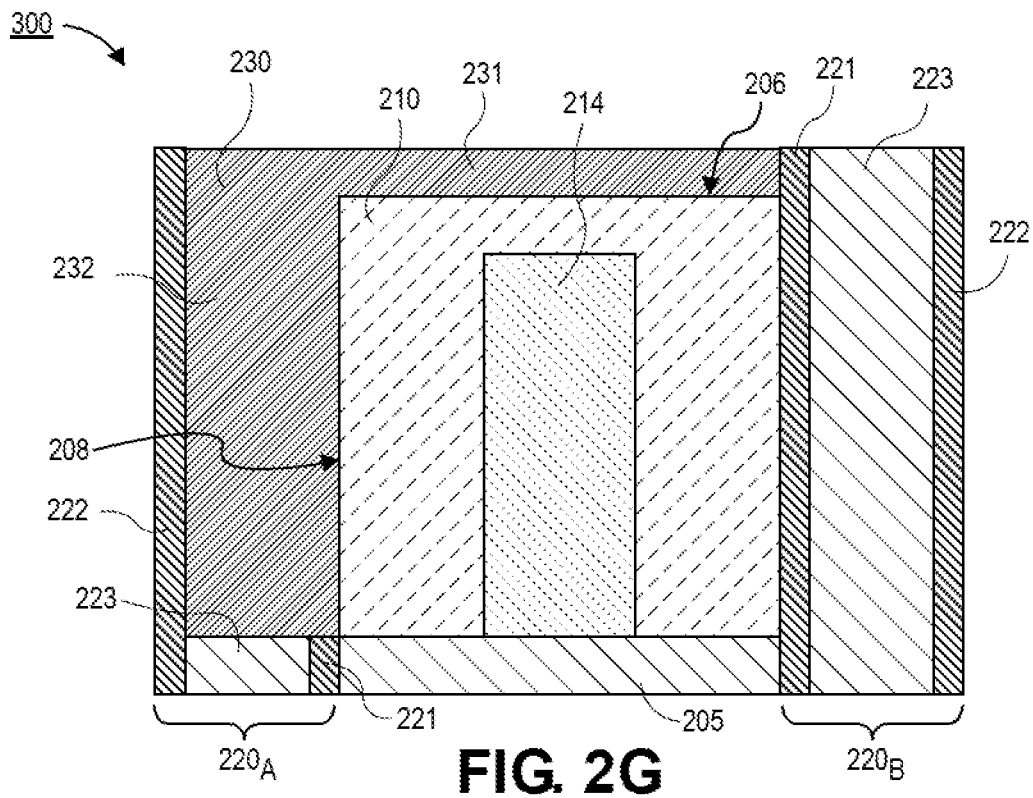
FIG. 2G is a cross-sectional illustration of a semiconductor device with a contact over a top surface and a first surface of a S/D region, in accordance with an embodiment.

Referring now to FIG. 2G, a cross-sectional illustration of a semiconductor device 200 is shown, in accordance with an additional embodiment. The semiconductor device 200 in FIG. 2G is substantially similar to the semiconductor device 100 in FIG. 1A, with the exception that the channels 112 are replaced with a fin-shaped channel 214. In an embodiment, a single fin-shaped channel 214 may be included or two or more fin-shaped channels 214 may be stacked over each other. Such a semiconductor device 200 may comprise any contact architecture similar to those described above in order to reduce contact resistance.

Figure 2H:
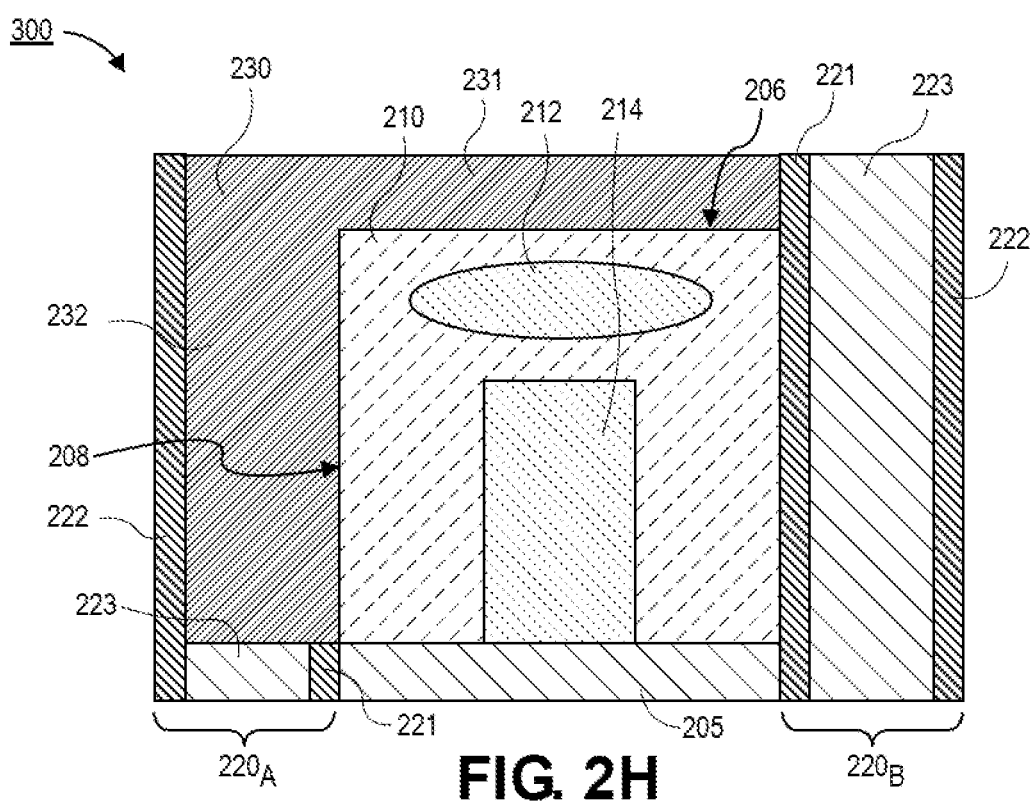
FIG. 2H is a cross-sectional illustration of a semiconductor device with a first transistor and a second transistor that are electrically coupled together by a common S/D region with a contact over a top surface and a first surface of the common S/D region, in accordance with an embodiment.

Referring now to FIG. 2H, a cross-sectional illustration of a semiconductor device 200 is shown, in accordance with an additional embodiment. The semiconductor device 200 in FIG. 2H is substantially similar to the semiconductor device 200 in FIG. 2G, with the exception that the stacked channels include a fin-shaped channel 214 and a nanoribbon shaped channel 212. Particularly, it is to be appreciated that embodiments include any combination of different channel geometries within the S/D region 210.

Referring now to FIGS. 3A-3E, an exemplary process flow that depicts a method for forming a semiconductor device in accordance with embodiments disclosed herein is shown, in accordance with an embodiment. Particularly, the illustrated process flow depicts a process for forming a semiconductor device 300 that is substantially similar to the semiconductor device 100 illustrated in FIG. 1A. However, it is to be appreciated that modifications to the process flow that are apparent to those skilled in the art may be made in order to fabricate semiconductor devices similar to those described in accordance with other embodiments disclosed herein.

Figure 3A:
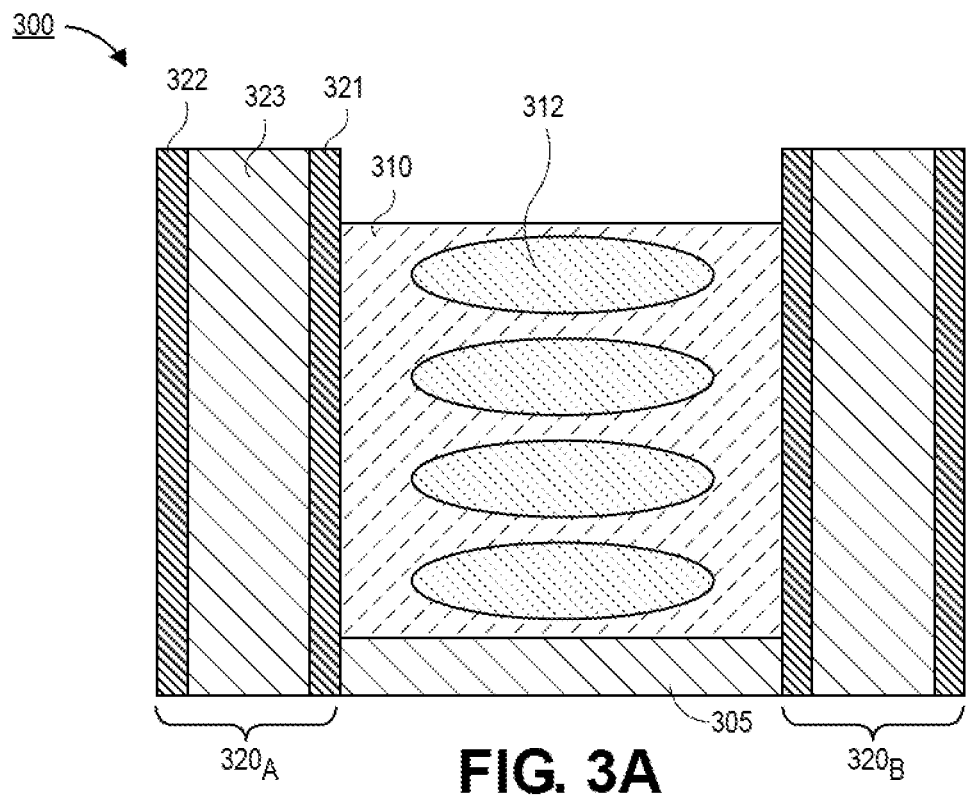
FIG. 3A is a cross-sectional illustration of a semiconductor device that comprises a stack of individual transistors that are coupled together by a common S/D region that is between a first isolation region and a second isolation region, in accordance with an embodiment.

Referring now to FIG. 3A, a cross-sectional illustration of a semiconductor device 300 is shown, in accordance with an embodiment. The semiconductor device 300 may comprise a plurality of stacked transistor channels 312 over a substrate 305. In an embodiment, the transistor channels 312 may be electrically coupled together by a common S/D region 310. In an embodiment, a first isolation region $320_A$ and a second isolation region $320_B$ may be positioned on opposite sides of the S/D region 310. The first isolation region $320_A$ and the second isolation region $320_B$ may comprise a first wall 321, a second wall 322, and a fill layer 323 between the first wall 321 and the second wall 322.

Figure 3B:
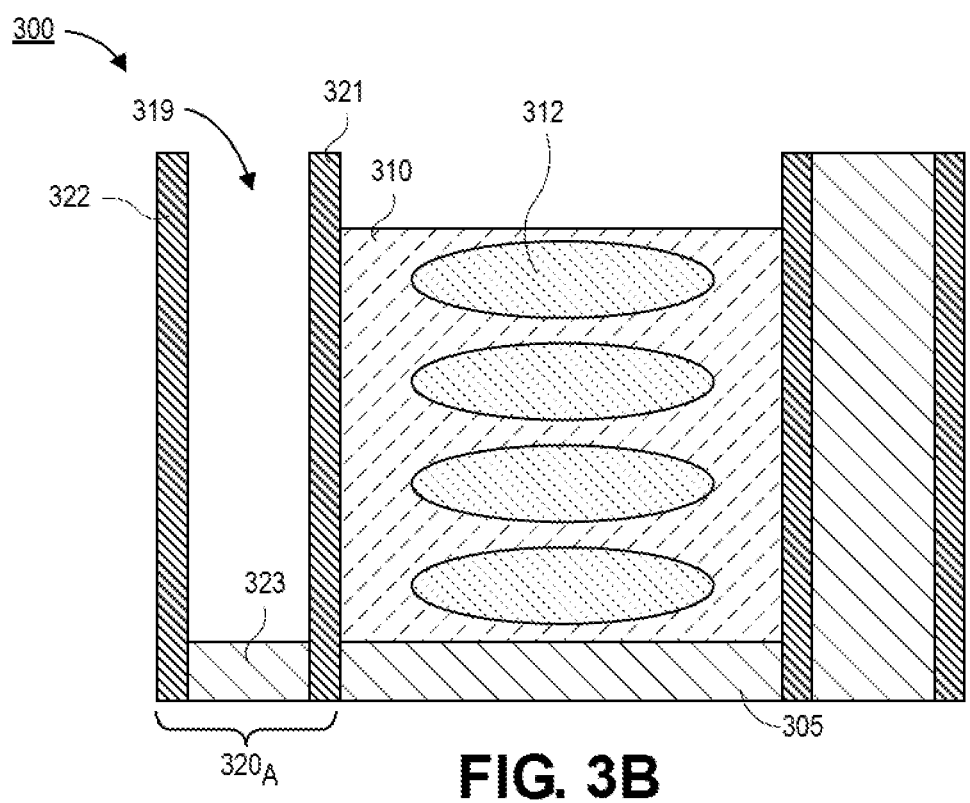
FIG. 3B is a cross-sectional illustration of the semiconductor device after a fill layer within the first isolation region is recessed, in accordance with an embodiment.

Referring now to FIG. 3B, a cross-sectional illustration of the semiconductor device 300 after the fill layer 323 in the first isolation region $320_A$ is recessed is shown, in accordance with an embodiment. In an embodiment, the fill layer 323 may be recessed with an etchant that is selective to the fill layer 323 over the first wall 321 and the second wall 322. In an embodiment, a mask layer (not shown) may protect other regions of the semiconductor device 300 from the etching process. Recessing the fill layer 323 may result in an opening 319 between the first wall 321 and the second wall 322.

Figure 3C:
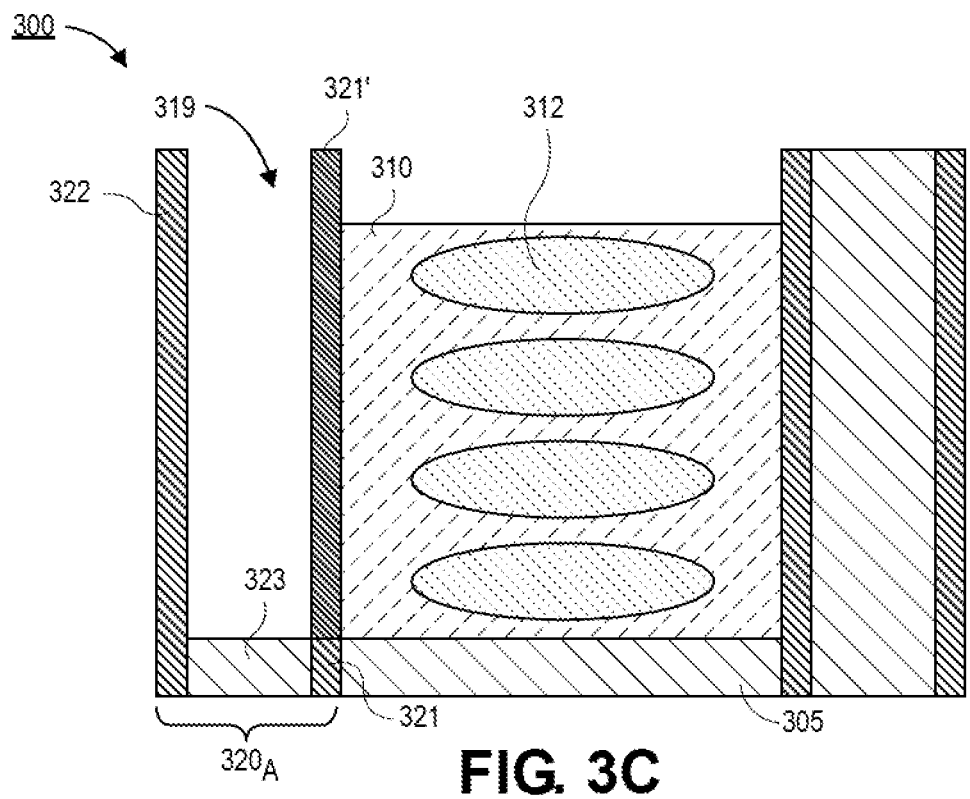
FIG. 3C is a cross-sectional illustration of the semiconductor device after a first wall of the first isolation region is modified to change an etch selectivity of the first wall, in accordance with an embodiment.

Referring now to FIG. 3C, a cross-sectional illustration of the semiconductor device 300 after the first wall 321 of the first isolation region $320_A$ is modified is shown, in accordance with an embodiment. In an embodiment, the modified first wall 321' may have a different etch selectivity than the second wall 322. For example, the first wall 321 may be modified with an angled implant or the like.

Figure 3D:
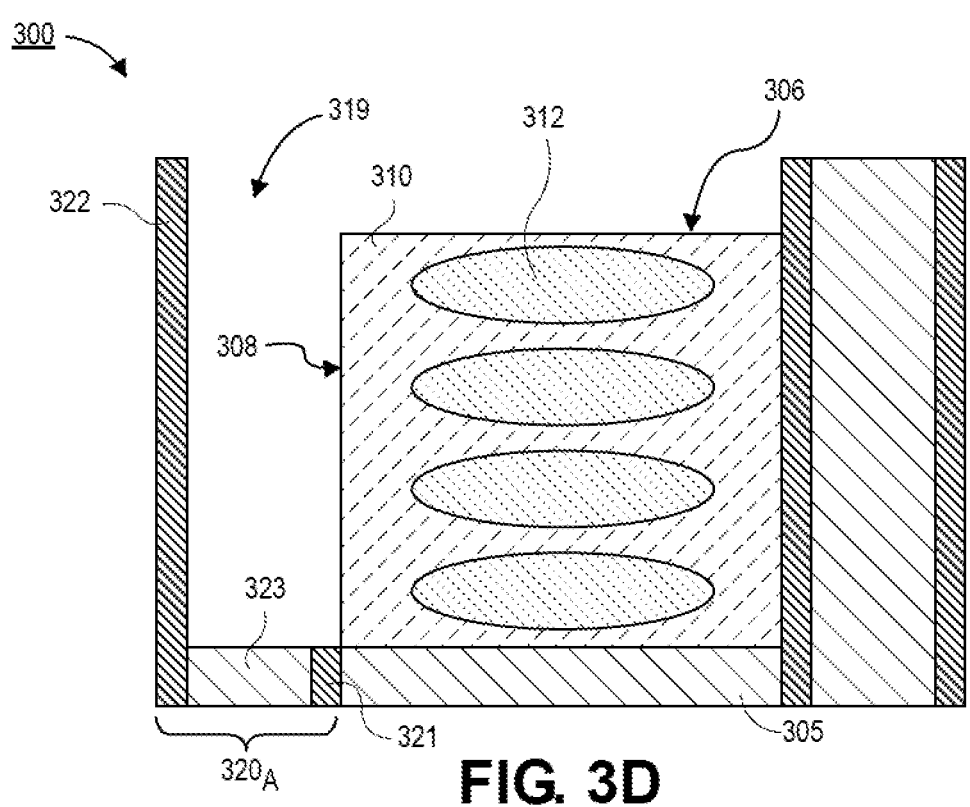
FIG. 3D is a cross-sectional illustration of the semiconductor device after a portion of the first wall is removed, in accordance with an embodiment.

Referring now to FIG. 3D, a cross-sectional illustration of the semiconductor device 300 after at least a portion of the first wall 321 is removed to expose a first surface 308 of the S/D region 310 is shown, in accordance with an embodiment. In an embodiment, the modified first wall 321' may be removed with an etching process that is selective to the modified first wall 321' over the second wall 322. In other embodiments, where the first wall 321 is not modified, an angled etching process may be used to selectively remove the first wall 321 without significantly etching the second wall 322. In an embodiment, a portion of the first wall 321 may remain in the final structure, as shown.

Figure 3E:
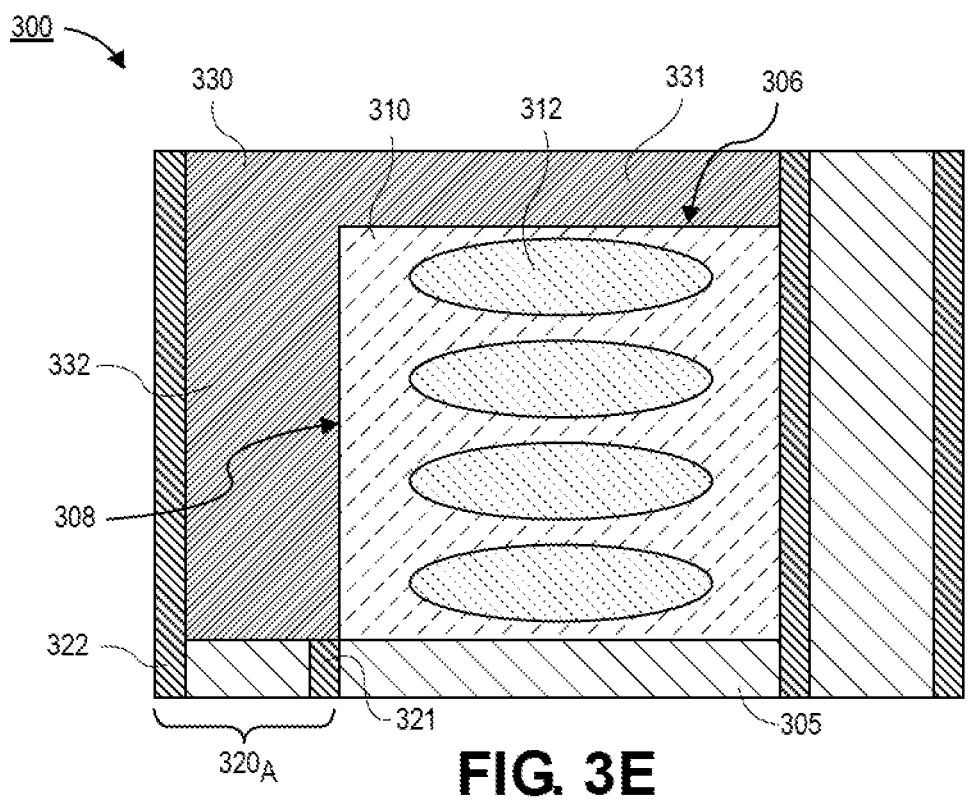
FIG. 3E is a cross-sectional illustration of the semiconductor device after a contact is disposed into the first isolation region, in accordance with an embodiment.

Referring now to FIG. 3E, a cross-sectional illustration of the semiconductor device 300 after a contact 330 is disposed in the opening 319 is shown, in accordance with an embodiment. In an embodiment, the contact 330 may comprise a horizontal portion 331 that is over a top surface 306 of the S/D region 310 and a vertical portion 332 that is over the first surface 308 of the S/D region 310.

Referring now to FIGS. 4A-4G, a series of cross-sectional illustrations that depict semiconductor devices 400 in accordance with various embodiments is shown. In each of the semiconductor device 400 a first component stack $450_A$ is separated from a second component stack $450_B$ by an isolation region 460. Each of the component stacks $450_A$/$450_B$ may comprise a plurality of components 455. In an embodiment, the components 455 may comprise one or more of transistors, diodes, capacitors, and inductors. However, it is to be appreciated that the components 455 may be any component needed in the semiconductor device 400 and is not limited to these particular examples. Furthermore, different types of components 455 may be included in a single component stack $450_A$/$450_B$ (e.g., the first component stack $450_A$ may comprise a transistor and a capacitor). In an embodiment, one or more of the topmost and/or bottommost components 455 may be directly contacted by a conductive material 451. Furthermore, while the component stacks $450_A$/$450_B$ are shown as having three components 455 each, it is to be appreciated that embodiments may include any number of components 455 in each component stack $450_A$/$450_B$. In an embodiment, each of the components 455 are electrically isolated from each other by an insulating layer 457. In an embodiment, the isolation region 460 comprises a pair of walls 461 that are separated by a fill layer 462. However, it is to be appreciated that in some embodiments, two or more adjacent components 455 may be electrically coupled together using through-S/D vias, similar to those described above in the Background section.

Figure 4A:
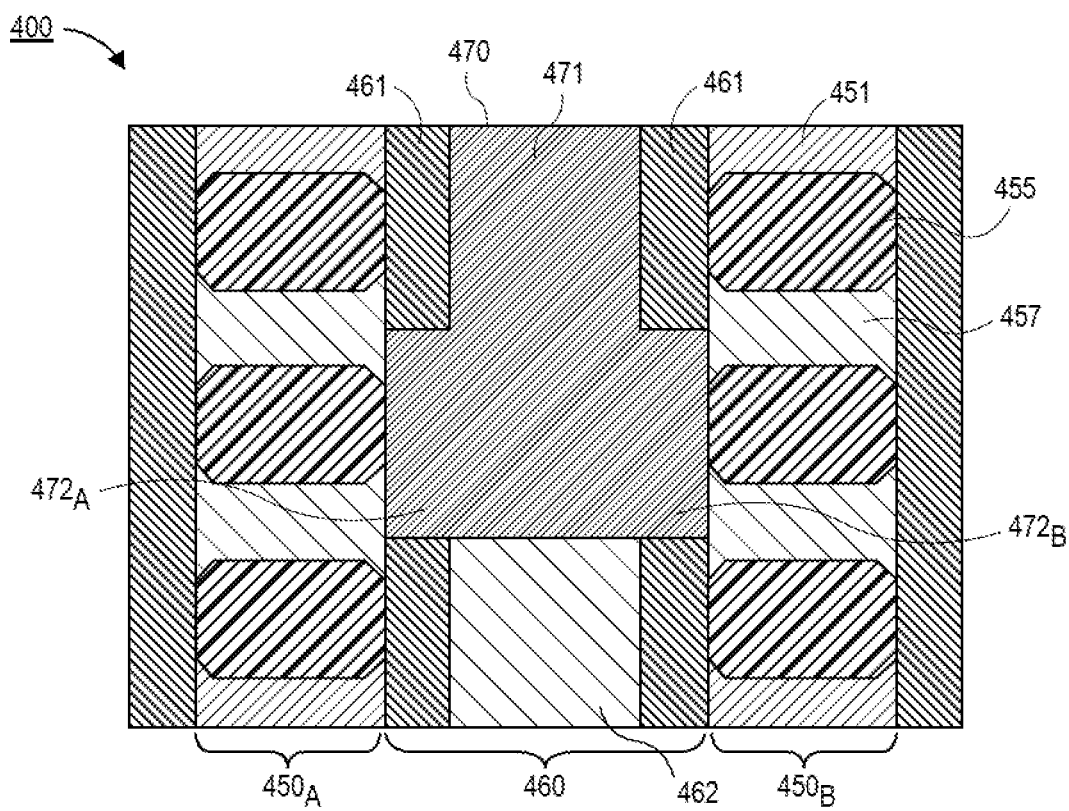
FIG. 4A is a cross-sectional illustration of a semiconductor device with a via in an isolation region, where the via extends horizontally to provide a connection to a component in a first stack and a component in a second stack, in accordance with an embodiment.

Referring now to FIG. 4A, a cross-sectional illustration of a semiconductor device 400 is shown, in accordance with an embodiment. In an embodiment, the semiconductor device 400 may comprise a via 470. The via 470 may be positioned in the isolation region 460. In an embodiment, the via 470 comprises a vertical portion 471 that extends vertically along the isolation region and first and second horizontal portions $472_A$ and $472_B$ that extend away from the vertical portion 471. The horizontal portions $472_A$/$472_B$ pass through the walls 461 of the isolation region 460 and contact components 455.

Figure 4B:
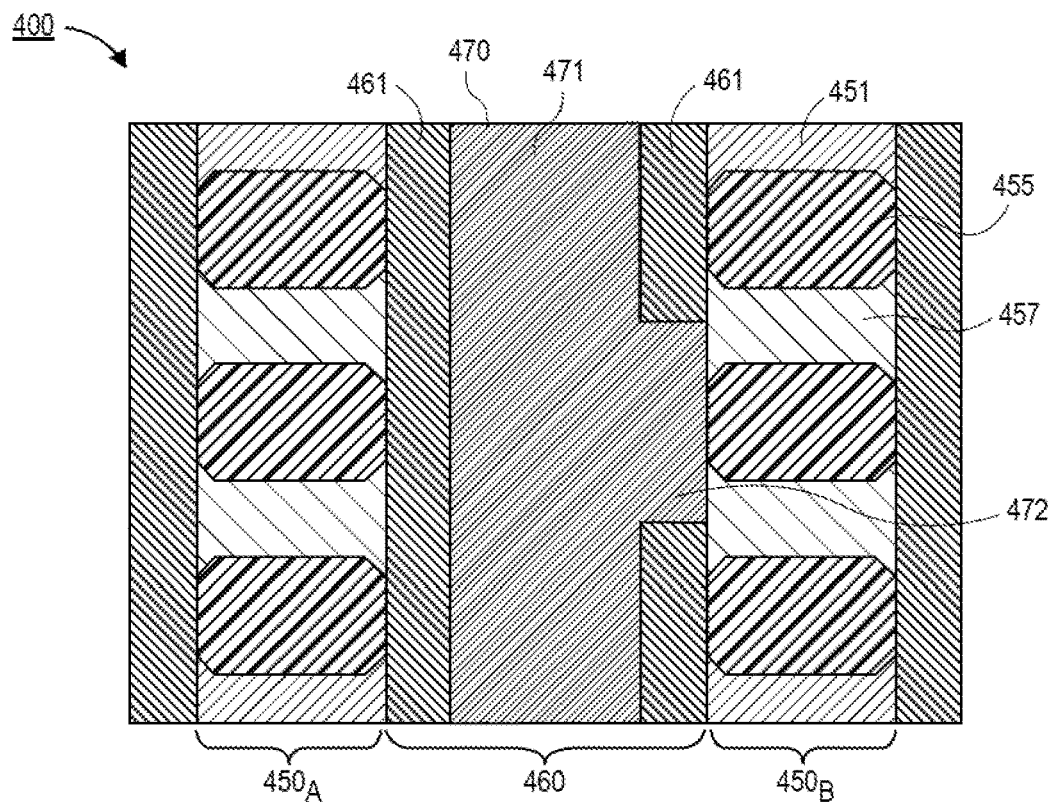
FIG. 4B is a cross-sectional illustration of a semiconductor device with a via in an isolation region, where the via extends horizontally to provide a connection to a component within a stack of components, in accordance with an embodiment.

Referring now to FIG. 4B, a cross-sectional illustration of a semiconductor device 400 is shown, in accordance with an embodiment. In an embodiment, the semiconductor device 400 comprises a via 470. The via 470 may be positioned in the isolation region 460. In an embodiment, the via 470 comprises a vertical portion 471 that extends through the isolation region 460. In the illustrated embodiment, the vertical portion 471 extends entirely through a thickness of the isolation region 460. While not visible in the plane of the cross-section in FIG. 4B, it is to be appreciated that vertical portion 471 may be contacted by the fill layer (i.e., in front of the vertical portion 471 (out of the page) and behind the vertical portion 471 (into the page)).

In the semiconductor device 400 in FIG. 4B, the via 470 comprises a single horizontal portion 472. The horizontal portion 472 may extend away from the vertical portion 471 and pass through a wall 461 of the isolation region 460. The horizontal portion 472 may provide an electrical connection to a component 455 in the second component stack $450_B$.

Figure 4C:
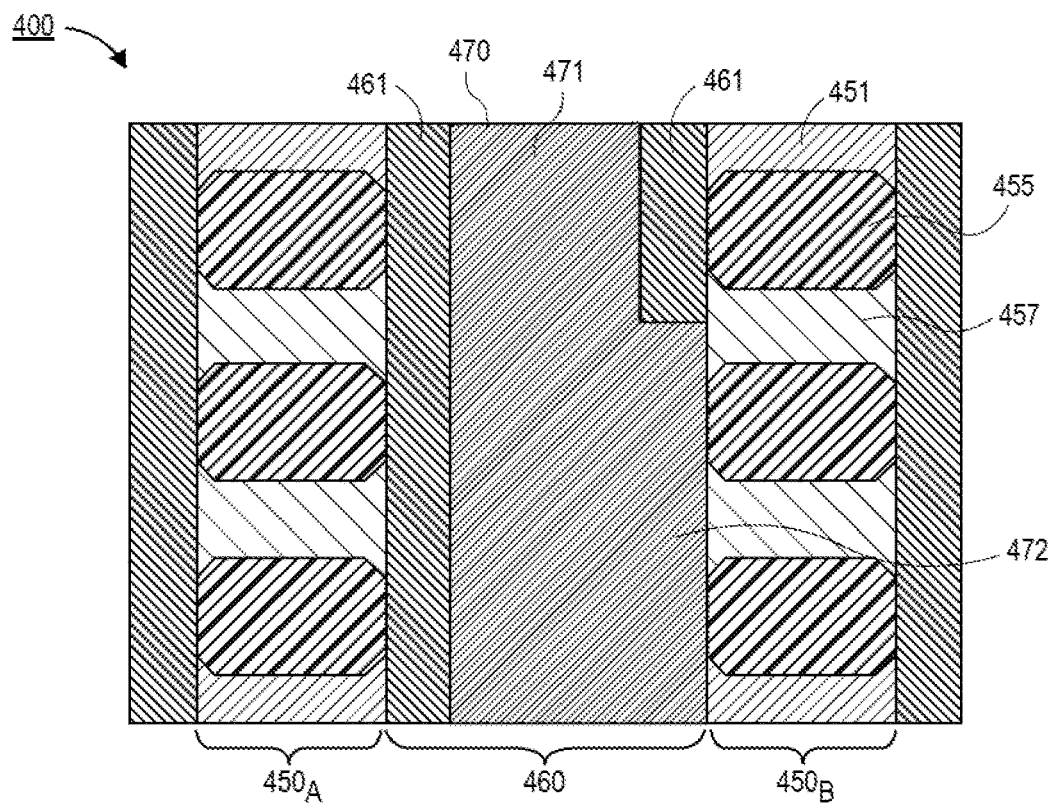
FIG. 4C is a cross-sectional illustration of a semiconductor device with a via in an isolation region, where the via extends horizontally to provide a connection to neighboring components within a stack of components, in accordance with an embodiment.

Referring now to FIG. 4C, a cross-sectional illustration of a semiconductor device 400 is shown, in accordance with an additional embodiment. The semiconductor device 400 in FIG. 4C is similar to the semiconductor device 400 in FIG. 4B, with the exception that the horizontal portion 472 of the via 470 contacts more than one component 455. For example, the horizontal portion 472 contacts two neighboring components 455.

Figure 4D:
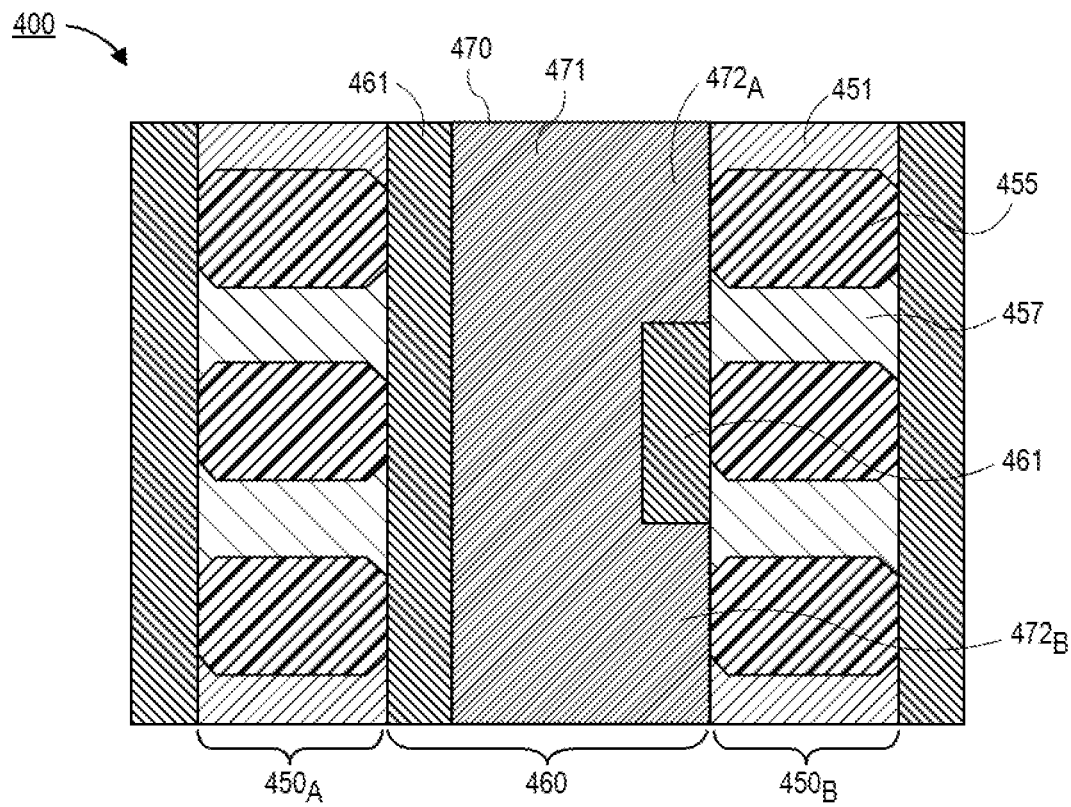
FIG. 4D is a cross-sectional illustration of a semiconductor device with a via in an isolation region, where the via extends horizontally to provide a connection to a first component and a second component within a stack of components, in accordance with an embodiment.

Referring now to FIG. 4D, a cross-sectional illustration of a semiconductor device 400 is shown, in accordance with an additional embodiment. The semiconductor device 400 in FIG. 4D is similar to the semiconductor device 400 in FIG. 4C, with the exception that a pair of horizontal portions $472_A$ and $472_B$ provide contact to two components 455 that are not adjacent to each other. Accordingly, it is possible to form connections to any desired combination of components 455 in a component stack 450.

Figure 4E:
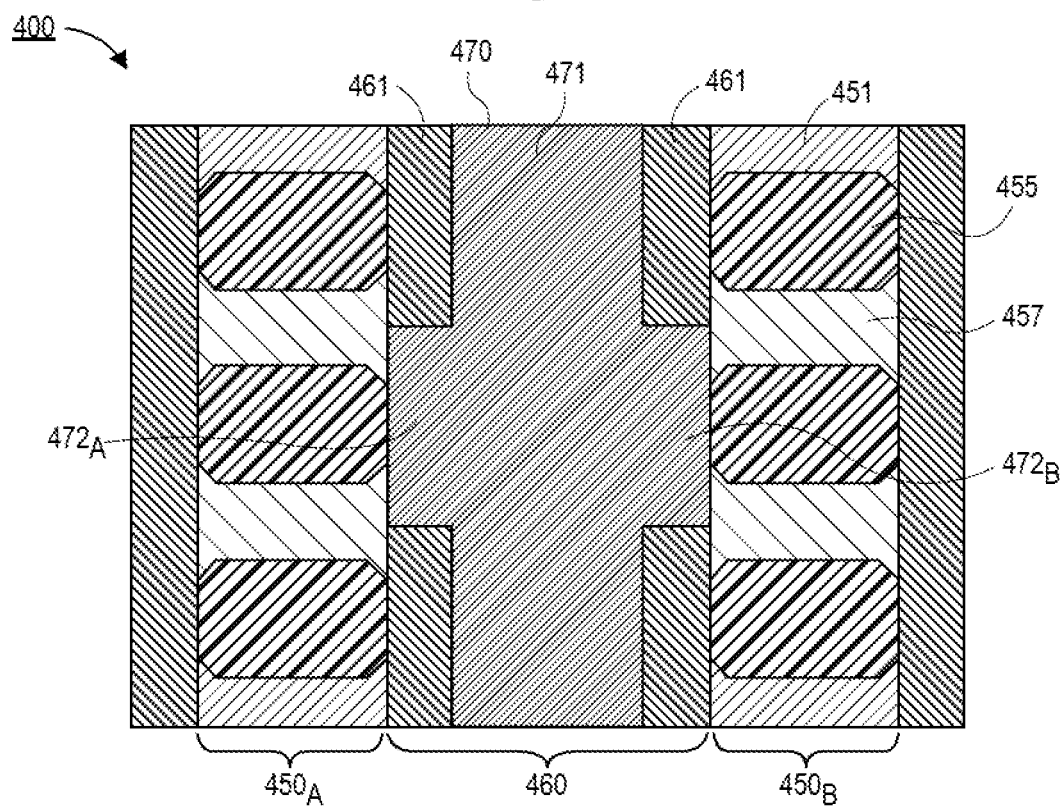
FIG. 4E is a cross-sectional illustration of a semiconductor device with a via that passes entirely through an isolation region and includes horizontal portions that provide a connection to a first component in a first stack and a second component in a second stack, in accordance with an embodiment.

Referring now to FIG. 4E, a cross-sectional illustration of a semiconductor device 400 is shown, in accordance with an additional embodiment. The semiconductor device 400 in FIG. 4E is similar to the semiconductor device 400 in FIG. 4A, with the exception that the vertical portion 471 of the via 470 extends through an entire thickness of the isolation region 460. Accordingly, access to the connected components 455 may be provided from either the front side or the back side of the semiconductor device 400.

Figure 4F:
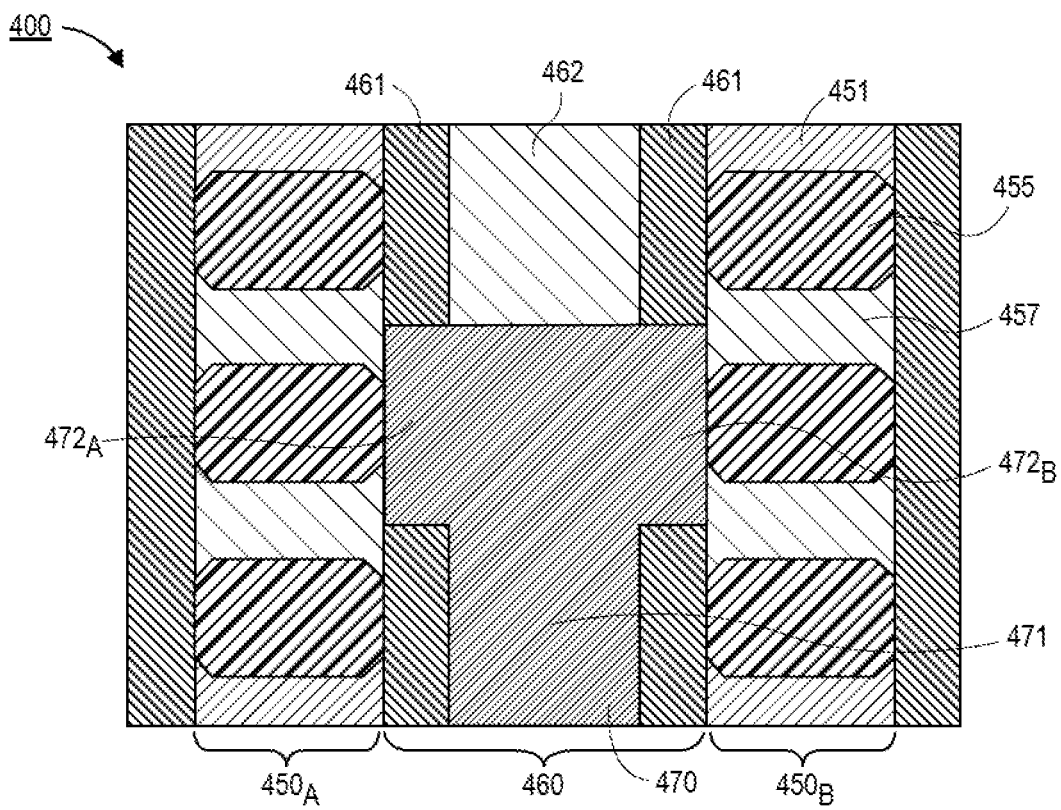
FIG. 4F is a cross-sectional illustration of a semiconductor device with a via in an isolation region, where the via extends horizontally to provide a connection to a component in a first stack and a component in a second stack, in accordance with an embodiment.

Referring now to FIG. 4F, a cross-sectional illustration of a semiconductor device 400 is shown, in accordance with an additional embodiment. The semiconductor device 400 in FIG. 4F is substantially similar to the semiconductor device 400 in FIG. 4A with the exception that the vertical portion 471 of the via 470 extends to a backside surface of the semiconductor device 400 instead of the front side surface of the semiconductor device.

Figure 4G:
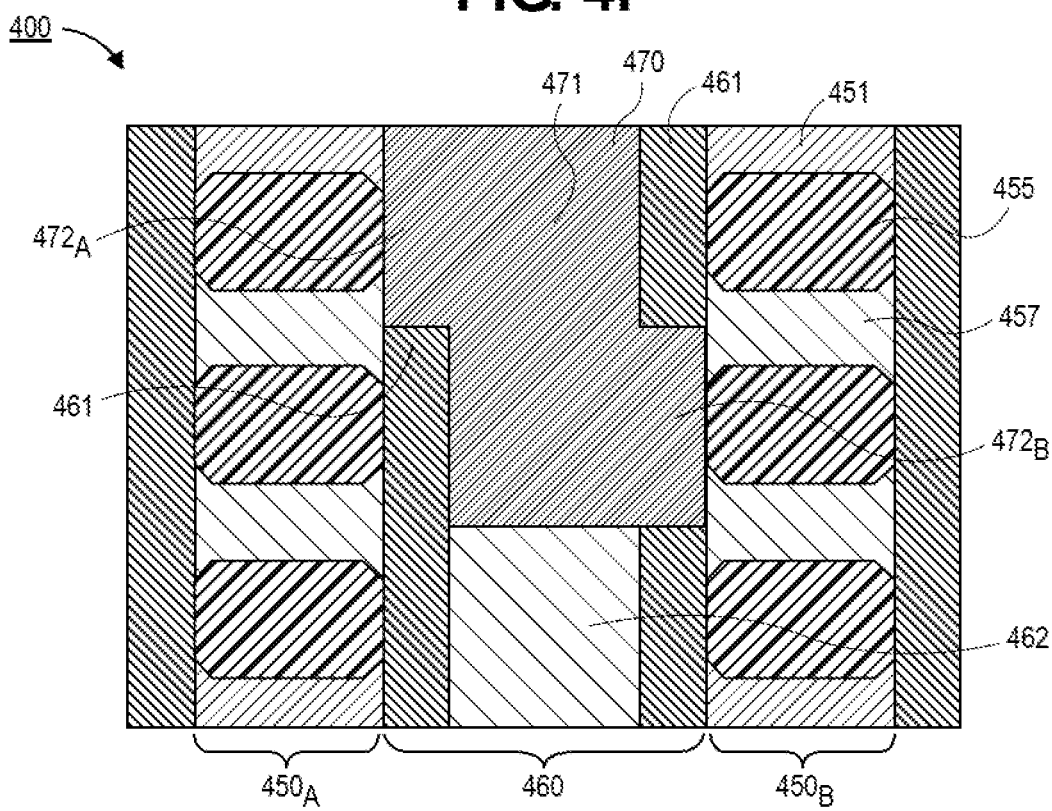
FIG. 4G is a cross-sectional illustration of a semiconductor device with a via in an isolation region, where the via extends horizontally to provide a connection to a first component in a first stack and a second component in a second stack that is in a different layer than the first component, in accordance with an embodiment.

Referring now to FIG. 4G, a cross-sectional illustration of a semiconductor device 400 is shown, in accordance with an additional embodiment. The semiconductor device 400 may comprise a via 470 that comprises a vertical portion 471 and a plurality of horizontal portions $472_A/472_B$. In an embodiment, a first horizontal portion $472_A$ contacts a component 455 in the first component stack $450_A$, and a second horizontal portion $472_B$ contacts a component 455 in the second component stack $450_B$. As shown, the first horizontal portion $472_A$ and the second horizontal portion $472_B$ extend out from the vertical portion 471 at different levels of the component stacks $450_A/450_B$. Accordingly, it is possible to form connections to any desired combination of components 455 in more than one component stack 450.

Referring now to FIGS. 5A-5F, an exemplary process flow that depicts a method for forming a semiconductor device in accordance with embodiments disclosed herein is shown, in accordance with an embodiment. Particularly, the illustrated process flow depicts a process for forming a semiconductor device 500 that is substantially similar to the semiconductor device 400 illustrated in FIG. 4A. However, it is to be appreciated that modifications to the process flow that are apparent to those skilled in the art may be made in order to fabricate semiconductor devices similar to those described in accordance with other embodiments disclosed herein.

Figure 5A:
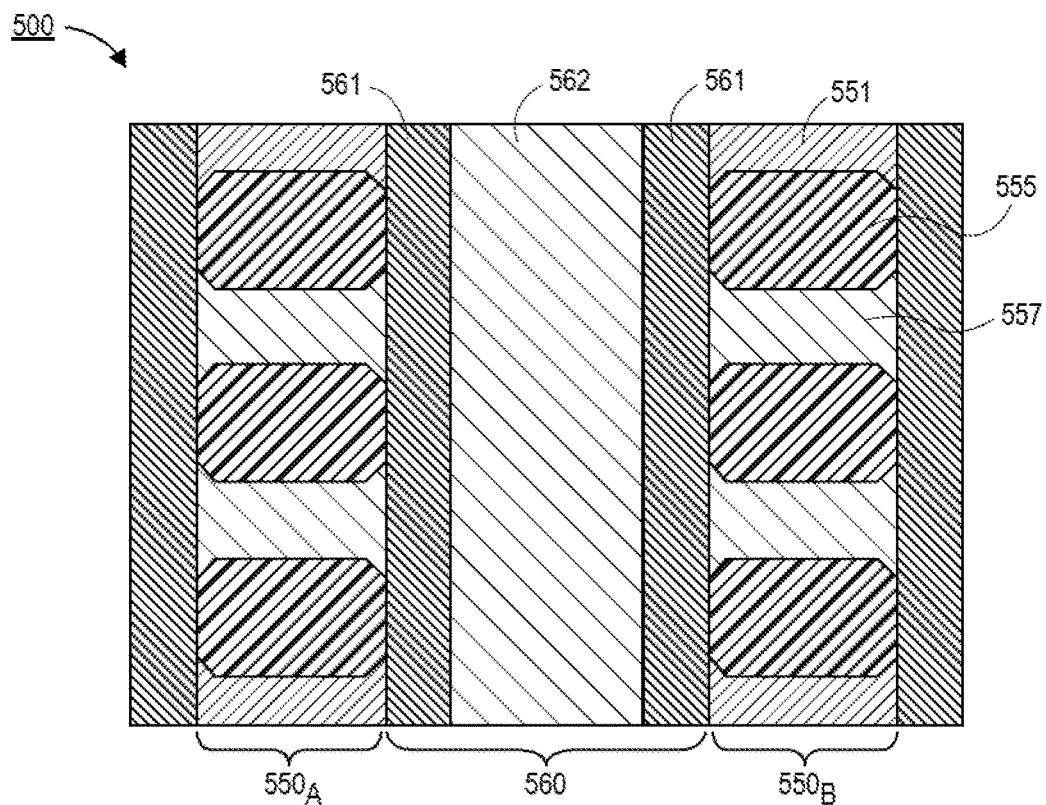
FIG. 5A is a cross-sectional illustration of a semiconductor device with a first stack of components, a second stack of components, and an isolation region between the first stack of components and the second stack of components, in accordance with an embodiment.

Referring now to FIG. 5A, a cross-sectional illustration of a semiconductor device 500 is shown, in accordance with an embodiment. In an embodiment, the semiconductor device 500 comprises a first component stack $550_A$ and a second component stack $550_B$. In an embodiment each component stack $550_A/550_B$ may comprise a plurality of components 555. The components 555 may be any component for a semiconductor device 500, such as, but not limited to transistors, diodes, capacitors, inductors, and the like. In an embodiment, topmost and/or bottommost components 555 may be contacted by a conductive layer 551. In an embodiment, the components 555 of each component stack $550_A/550_B$ may be electrically isolated from neighboring components 555 by an insulative layer 557.

In an embodiment, an isolation region 560 may be positioned between the first component stack $550_A$ and the second component stack $550_B$. The isolation region 560 may comprise walls 561 and a fill layer 562 between the walls 561. The walls 561 may be in direct contact with portions of the components 555 in the component stacks $550_A/550_B$. In an embodiment, the walls 561 may be a first insulating material and the fill layer 562 may be a second insulating material. The second insulating material may be etch selective to the first insulating material.

Figure 5B:
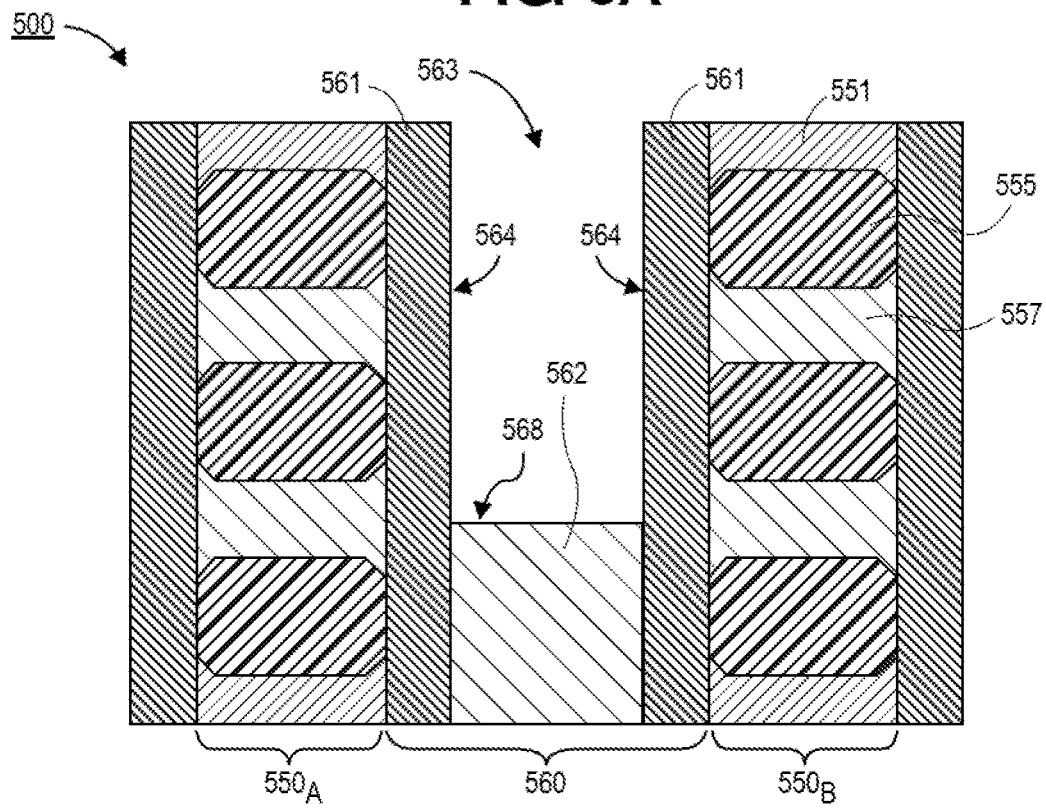
FIG. 5B is a cross-sectional illustration of the semiconductor device after a fill layer in the isolation region is recessed, in accordance with an embodiment.

Referring now to FIG. 5B, a cross-sectional illustration of the semiconductor device 500 after the fill layer 562 is recessed is shown, in accordance with an embodiment. Recessing the fill layer 562 forms an opening 563 that exposes surfaces 564 of the walls 561. In a particular embodiment, the fill layer 562 may be recessed so that a top surface 568 of the fill layer 562 is below one or more of the components 555. In some embodiments, the top surface 568 of the fill layer 562 may be above one or more of the components 555.

Figure 5C:
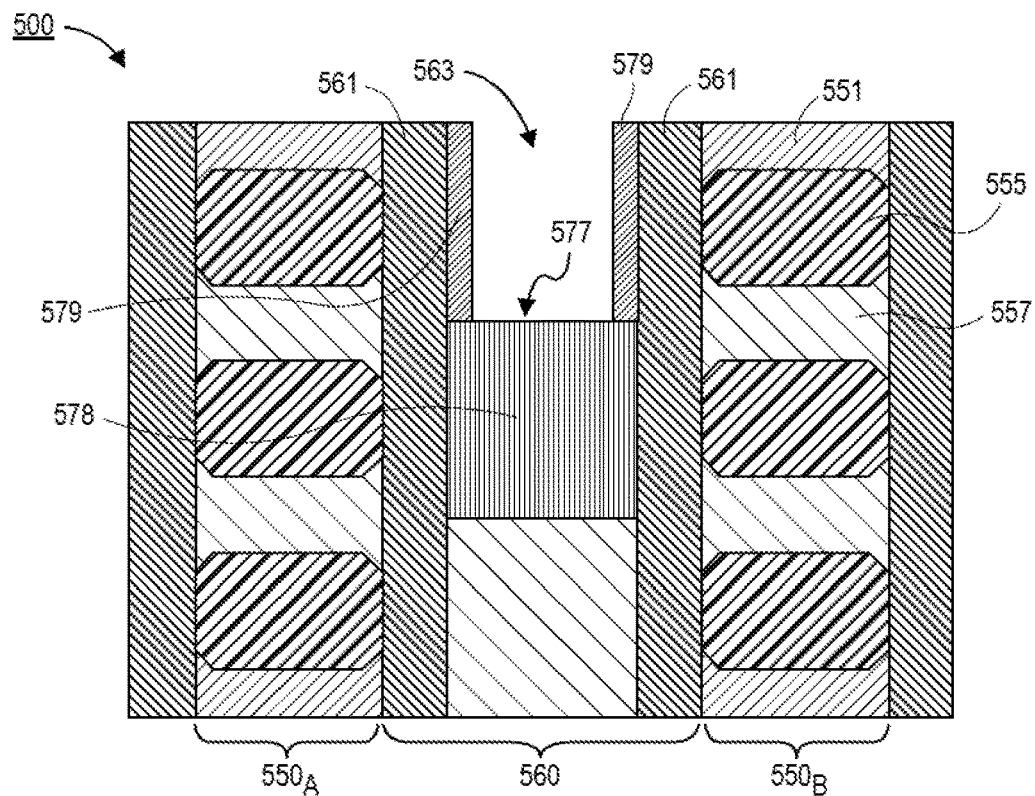
FIG. 5C is a cross-sectional illustration after a sacrificial layer is disposed over the fill layer and a mask layer is disposed along sidewalls of the isolation layer, in accordance with an embodiment.

Referring now to FIG. 5C, a cross-sectional illustration of the semiconductor device 500 after a sacrificial layer 578 and a mask layer 579 is disposed over the fill layer 562. In an embodiment, the sacrificial layer 578 may be blanket deposited and etched back. For example, the sacrificial layer 578 may have a thickness that substantially overlaps the Z-height of one or more components 555. For example, in the illustrated embodiment, a top surface 577 of the sacrificial layer 578 is above the middle component 555 in the component stacks $550_A/550_B$ and substantially overlaps the Z-height of the middle components 555. The thickness and position of the sacrificial layer 578 defines which of the components 555 will be contacted by the via in subsequent processing operations.

In an embodiment, a mask layer 579 may be disposed over the walls 561 that define the opening 563. For example, the mask layer 579 may be conformally deposited and then etched with an etching process that substantially removes portions of the mask layer along horizontal surfaces while leaving the mask layer 579 along vertical surfaces. For example, the deposition and etching process may be similar to so called "spacer etching" processes used in the semiconductor art. Accordingly, the mask layer 579 lines the remaining portion of the opening 563 while exposing the top surface 577 of the sacrificial layer 578.

Figure 5D:
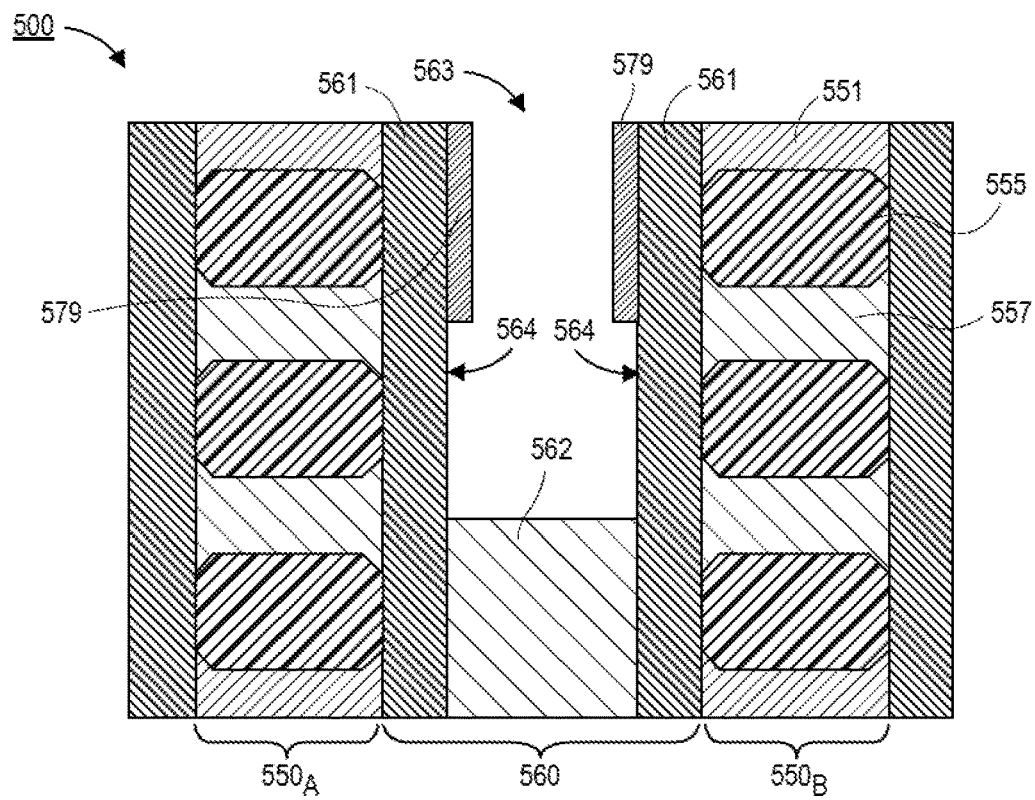
FIG. 5D is a cross-sectional illustration after the sacrificial layer is removed, in accordance with an embodiment.

Referring now to FIG. 5D, a cross-sectional illustration of the semiconductor device 500 after the sacrificial layer 578 is removed is shown, in accordance with an embodiment. In an embodiment, the sacrificial layer 578 is removed with an etching process that is selective to the sacrificial layer 578 over the mask layer 579 and the fill layer 562. Accordingly, the fill layer 562 and portions of the surfaces 564 of the walls 561 are exposed.

Figure 5E:
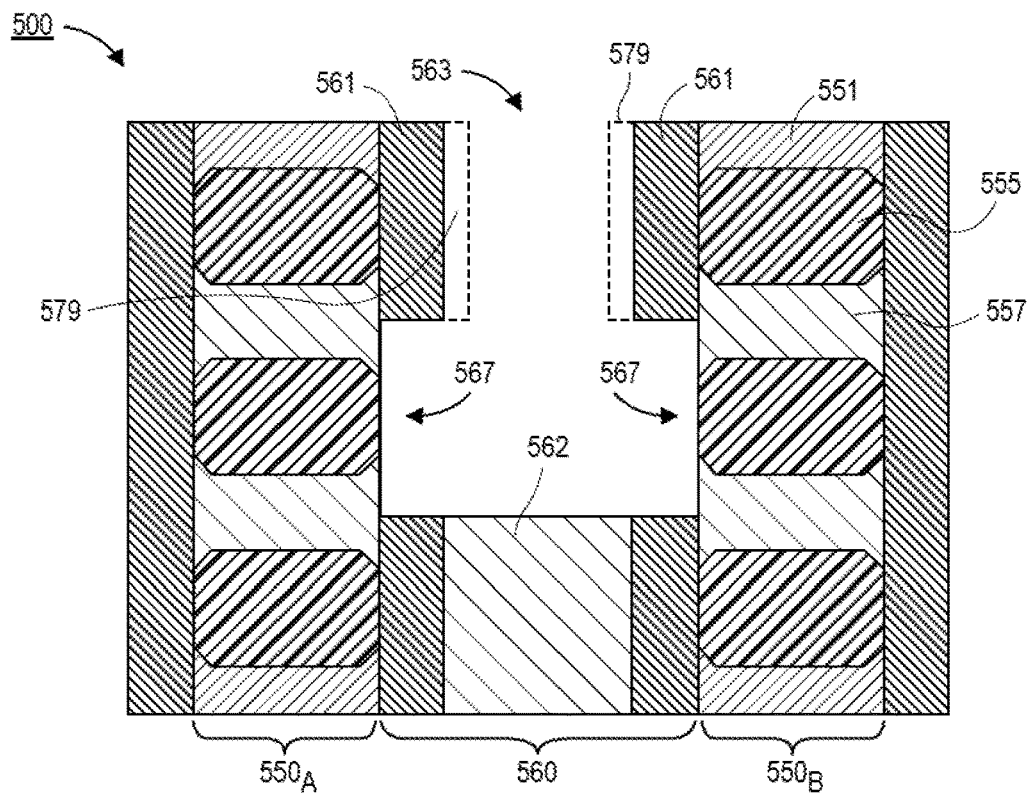
FIG. 5E is a cross-sectional illustration after openings are formed through the sidewalls of the isolation layer, in accordance with an embodiment.

Referring now to FIG. 5E, a cross-sectional illustration of the semiconductor device 500 after openings 567 through the walls 561 are formed is shown, in accordance with an embodiment. The openings 567 expose portions of the components 555 that are in the component stacks $550_A/550_B$. In an embodiment, the walls 561 may be selectively etched relative to the fill layer 562. In some embodiments, the etching process may also remove the mask layer 579 (indicated by dashed lines). In other embodiments, all or a portion of the mask layer 579 may survive the etching process and be present in the final structure. In some embodiments, any residual portion of the mask layer 579 may be removed after forming the openings 567.

Figure 5F:
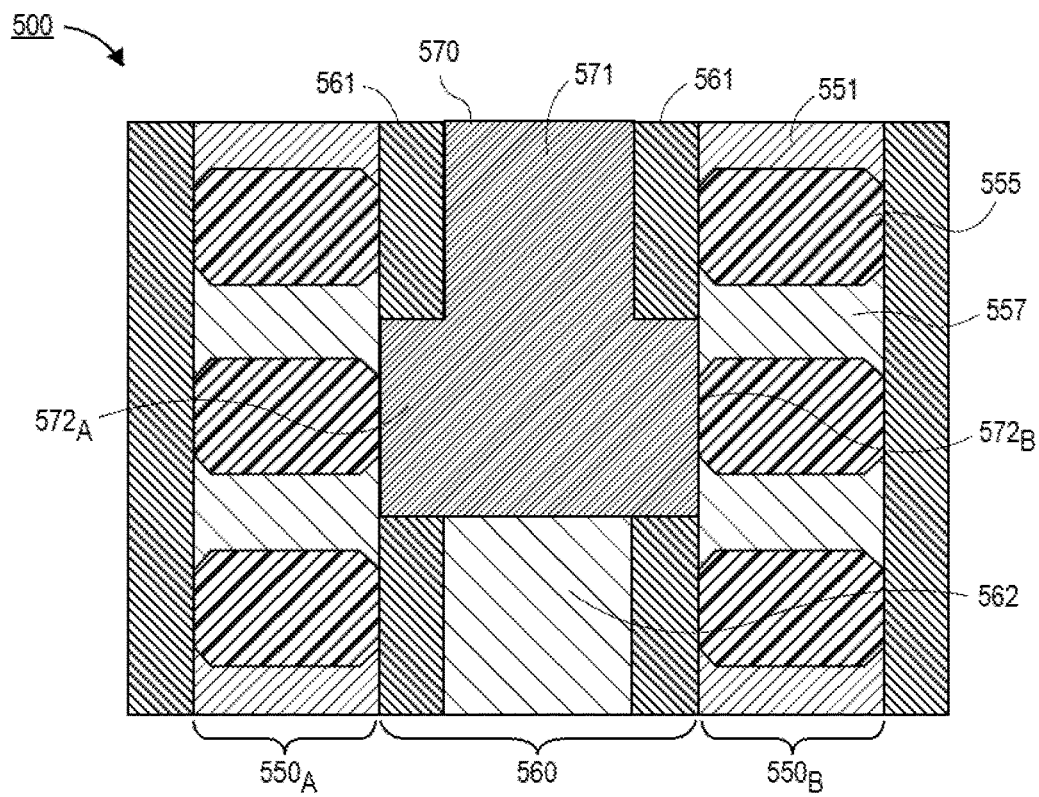
FIG. 5F is a cross-sectional illustration after a via is disposed in the isolation region, in accordance with an embodiment.

Referring now to FIG. 5F, a cross-sectional illustration of the semiconductor device 500 after a via 570 is disposed in the opening 563 is shown, in accordance with an embodiment. In an embodiment, the via 570 may be a conductive material that provides electrical connections to one or more components 555. In an embodiment, the via 570 may comprise a vertical portion 571 that extends along the thickness of the isolation region 560 and one or more horizontal portions that extend away from the vertical portion 571 and pass through the walls 561 of the isolation region 560. Accordingly, electrical connections to buried components 555 may be made without the need for a staircase style interconnect architecture.

Figure 6A:
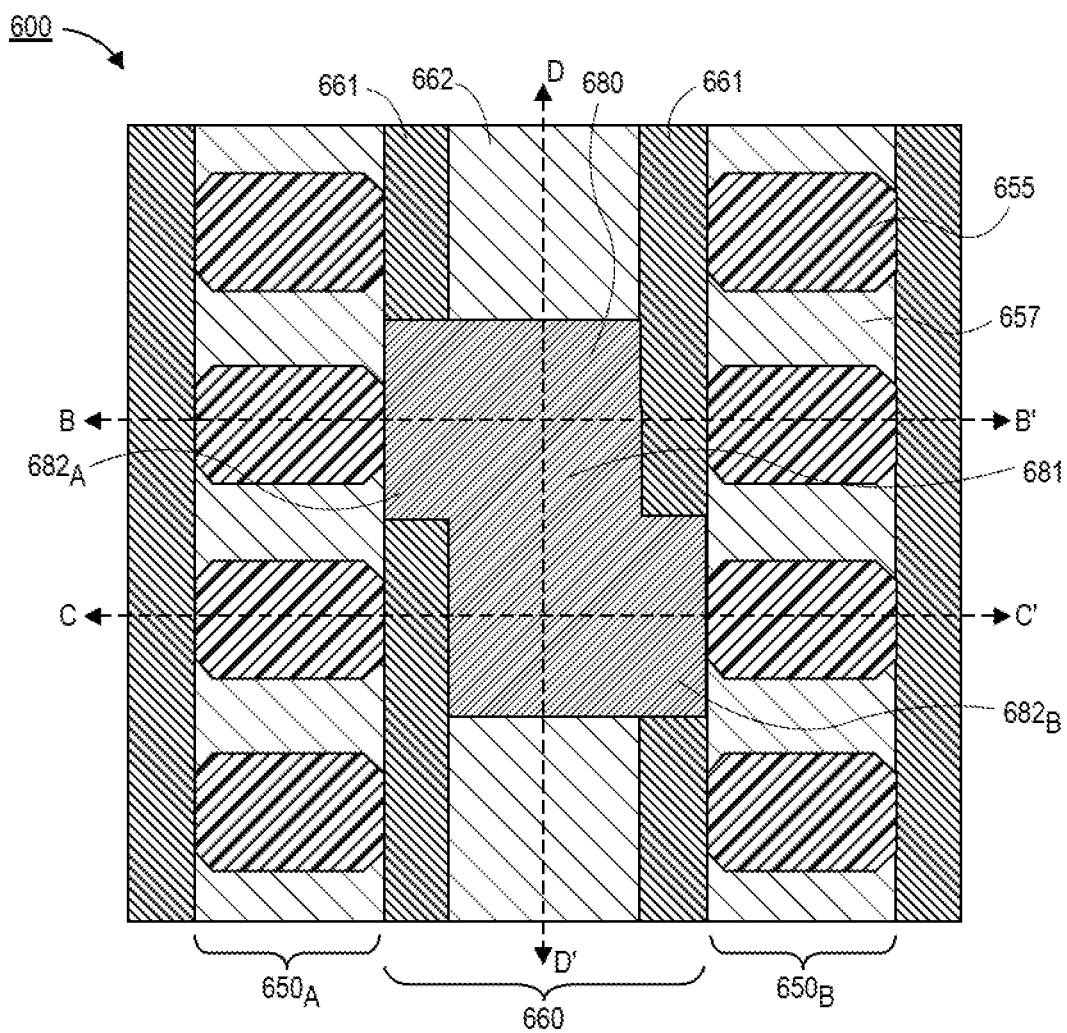
FIG. 6A is a top-down illustration of a layer within a semiconductor device that includes an interconnect through an isolation region that electrically couples non-adjacent components together, in accordance with an embodiment.
Figure 6B:
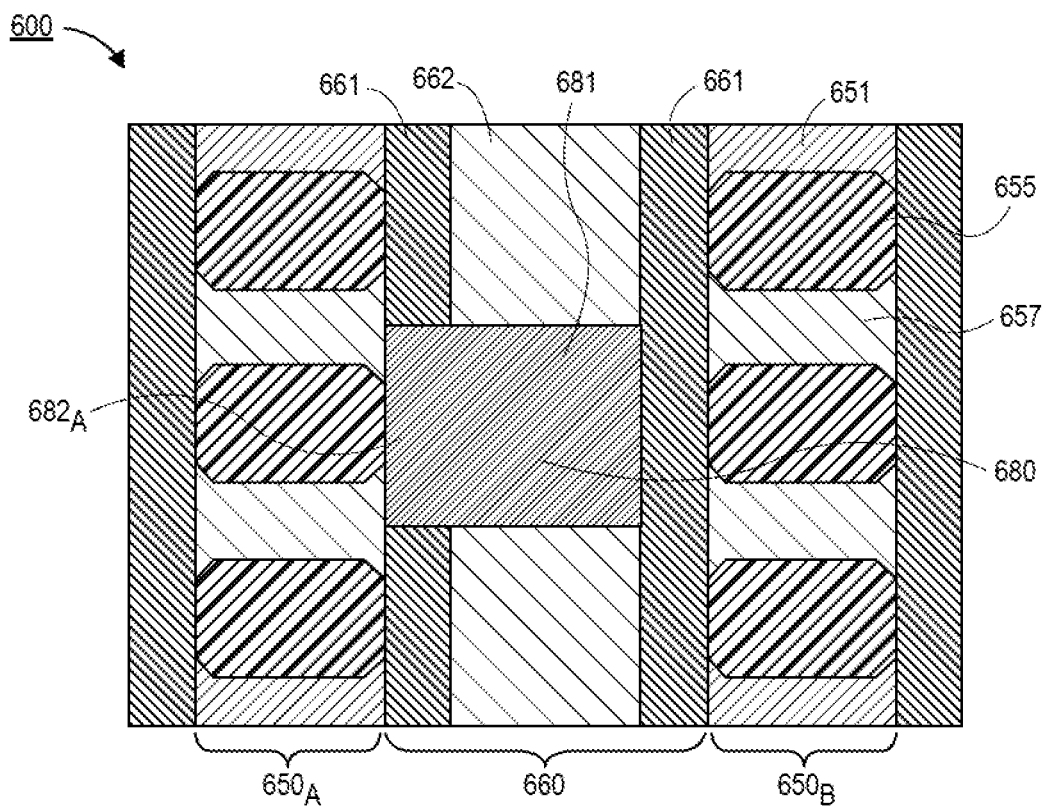
FIG. 6B is a cross-sectional illustration of the semiconductor device in FIG. 6A along line B-B', in accordance with an embodiment.
Figure 6C:
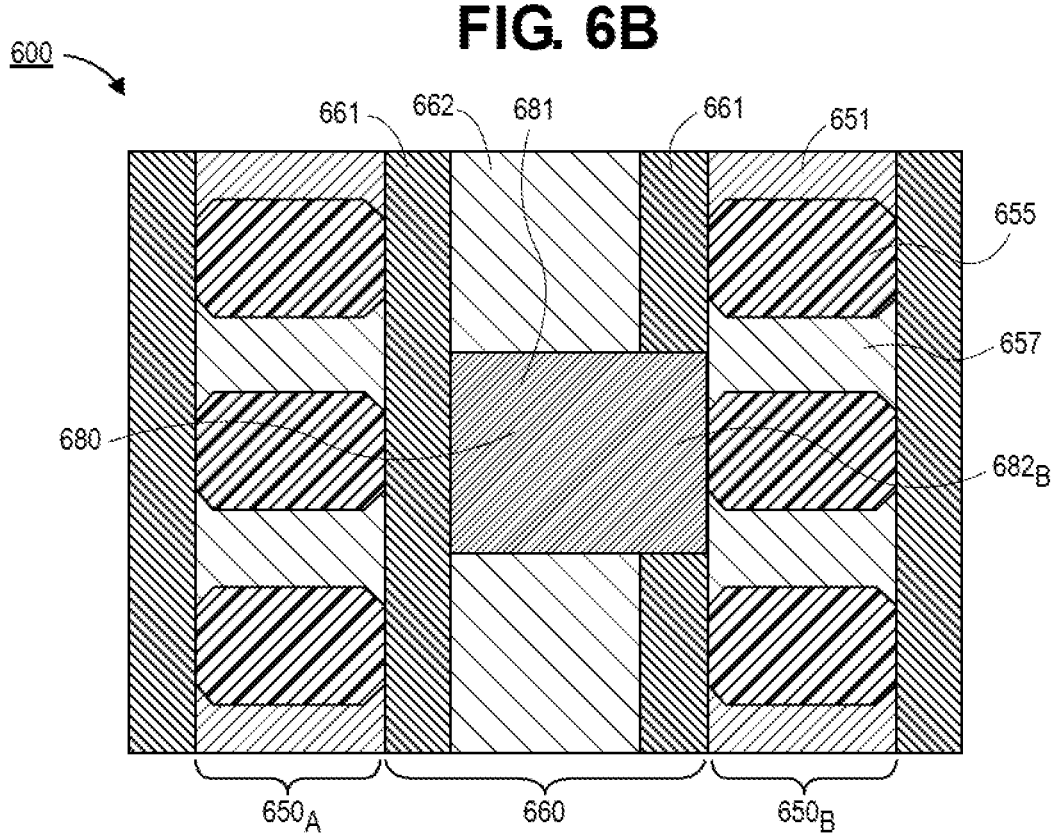
FIG. 6C is a cross-sectional illustration of the semiconductor device in FIG. 6A along line C-C', in accordance with an embodiment.
Figure 6D:
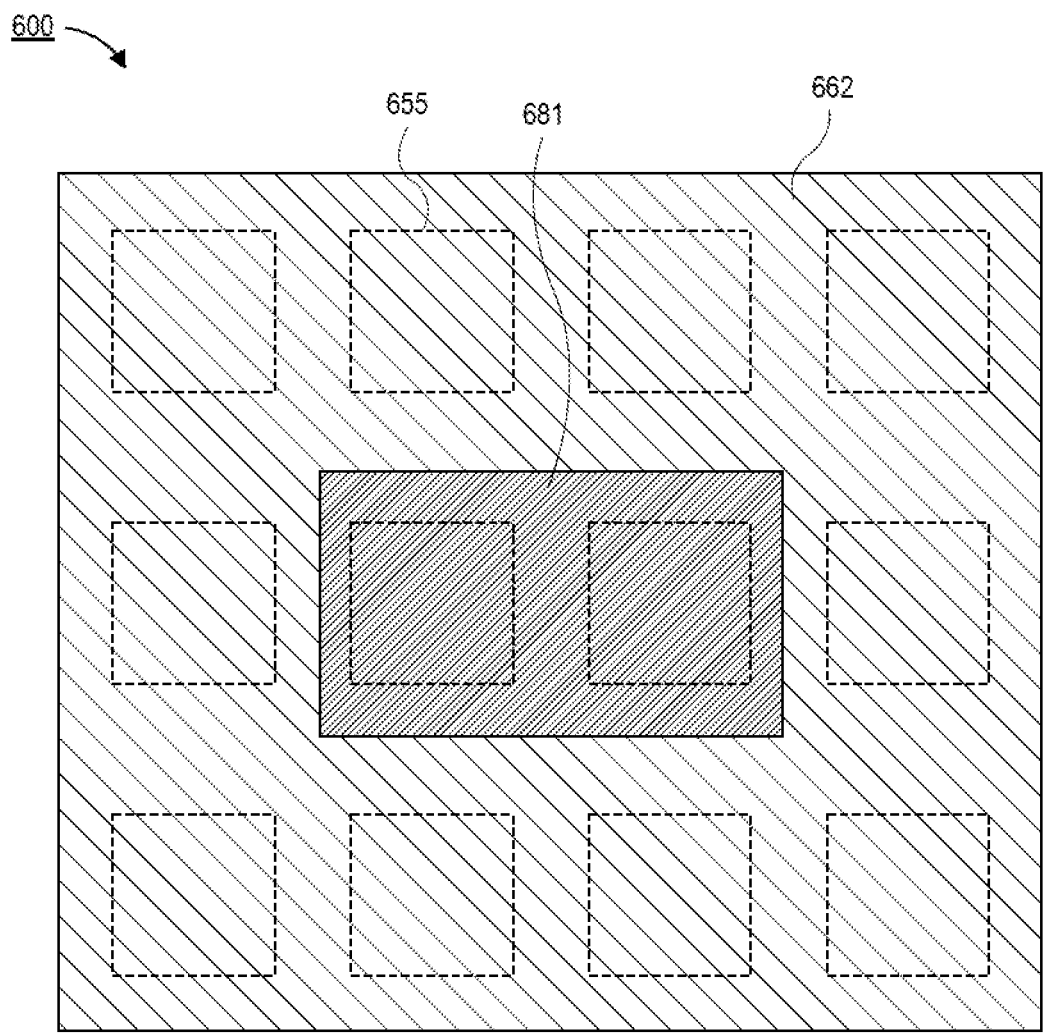
FIG. 6D is a cross-sectional illustration of the semiconductor device in FIG. 6A along line D-D', in accordance with an embodiment.

Referring now to FIGS. 6A-6D, a series of illustrations depict an interconnect architecture that allows for coupling components within a single layer with an entirely buried interconnect. FIG. 6A is a top down view of a buried layer of a semiconductor device 600. FIGS. 6B-6D are cross-sectional illustrations of FIG. 6A along various planes.

Referring now to FIG. 6A, a single layer of a semiconductor device 600 is shown. As shown, the semiconductor device 600 comprises a first array of components $650_A$ and a second array of components $650_B$. In an embodiment, an isolation region 660 is positioned between the first array of components $650_A$ and the second array of components $650_B$.

In an embodiment, the first and second array of components $650_A/650_B$ may each comprise a plurality of components 655. In FIG. 6A, there are four components shown in the illustrated layer of each array of components $650_A/650_B$. It is to be appreciated that each array of components $650_A/650_B$ may also comprise any number of layers (as will be shown in FIGS. 6B and 6C). The components 655 may be electrically isolated from each other by an insulating layer 657.

In an embodiment, the isolation region 660 may comprise walls 661 that are separated from each other by a fill layer 662. In an embodiment, an interconnect 680 may provide an electrical connection between two or more different components 655 within the layer. In the illustrated embodiment, a first component 655 in the first array of components $650_A$ is electrically coupled to a second component 655 in the second array of components $650_B$. However, it is to be appreciated that the interconnect 680 may also provide electrical coupling between components 655 within a single array of components 650. In an embodiment, the interconnect 680 may comprise a first portion 681 that runs substantially parallel to the walls 661 and second portions $682_A/682_B$ that extend away from the first portion 681 and pass through the walls 661. The second portions $682_A/682_B$ may contact one or more of the components 655.

Referring now to FIG. 6B, a cross-sectional illustration of the semiconductor device 600 along line B-B' is shown, in accordance with an embodiment. In FIG. 6B a single column of the first array of components $650_A$ and a single column of the second array of components $650_B$ is shown. For example, each column may comprise two or more stacked components 655 (three components 655 are illustrated in each column in FIG. 6B). A metal layer 651 may be over a topmost and/or bottommost components 655. As shown, the interconnect 680 may be entirely buried within the isolation region 660, with a second portion $682_A$ passing through the wall 661 to contact a component 655 in the first array of components $650_A$.

Referring now to FIG. 6C, a cross-sectional illustration of the semiconductor device 600 along line C-C' is shown, in accordance with an embodiment. In FIG. 6C a single column of the first array of components $650_A$ and a single column of the second array of components $650_B$ is shown. For example, each column may comprise two or more stacked components 655 (three components 655 are illustrated in each column in FIG. 6C). A metal layer 651 may be over a topmost and/or bottommost components 655. As shown, the interconnect 680 may be entirely buried within the isolation region 660, with a second portion $682_B$ passing through the wall 661 to contact a component 655 in the second array of components $650_B$.

Referring now to FIG. 6D, a cross-sectional illustration of the semiconductor device 600 along line D-D' is shown, in accordance with an embodiment. As shown, the first portion 681 of the interconnect extends along the plane parallel to the walls 661 (not shown). Furthermore, the interconnect is entirely buried in the fill layer 662. That is, there is no connection up or down to a front side or backside surface of the semiconductor device 600. In FIG. 6D outlines of the components 655 are shown with dashed lines to indicate that they are either into or out of the illustrated plane.

Figure 7:
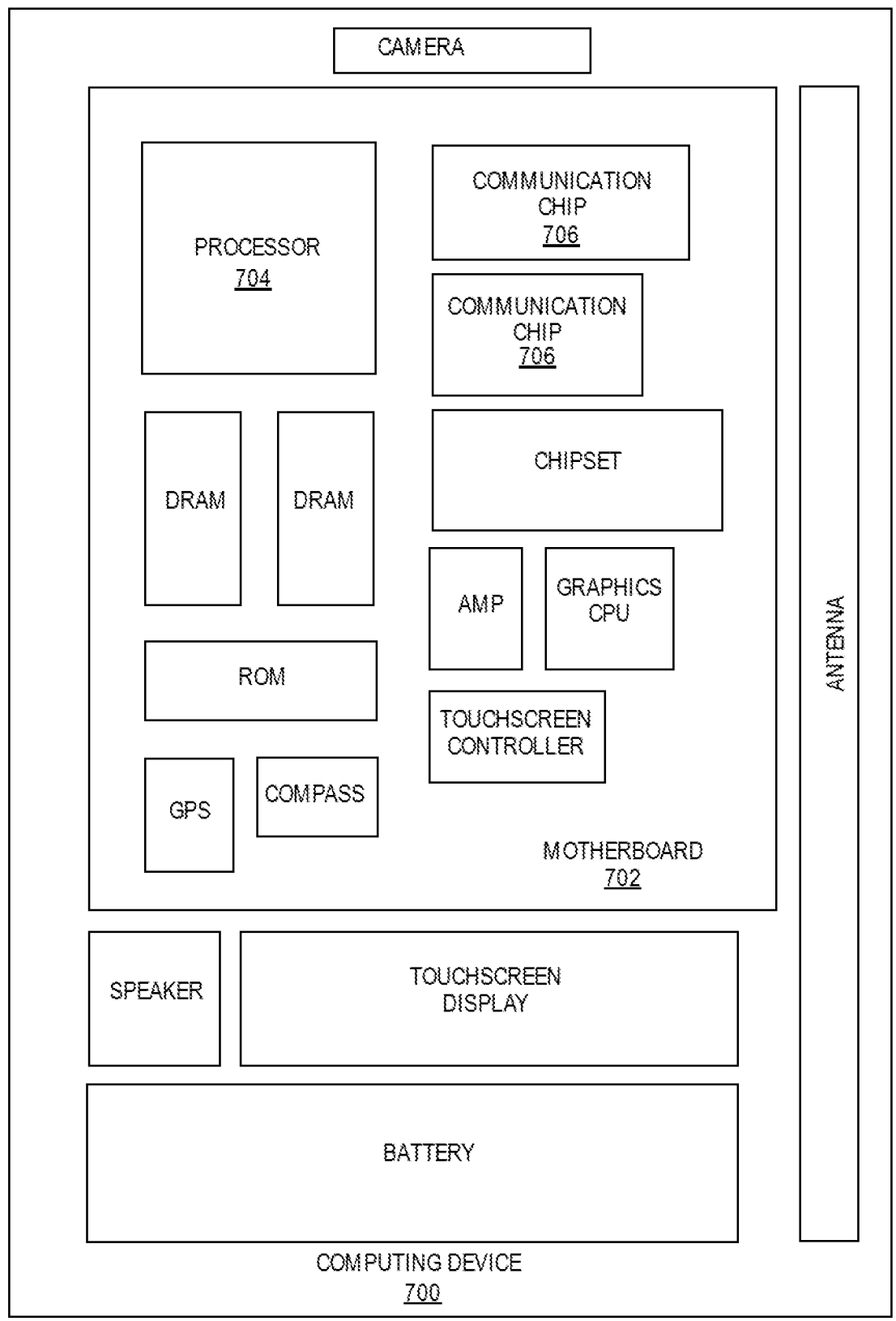
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise a plurality of stacked components with a contact or via disposed in an isolation region adjacent to the stacked components, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip may comprise a plurality of stacked components with a contact or via disposed in an isolation region adjacent to the stacked components, as described herein.

In further implementations, another component housed within the computing device 700 may comprise a plurality of stacked components with a contact or via disposed in an isolation region adjacent to the stacked components, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
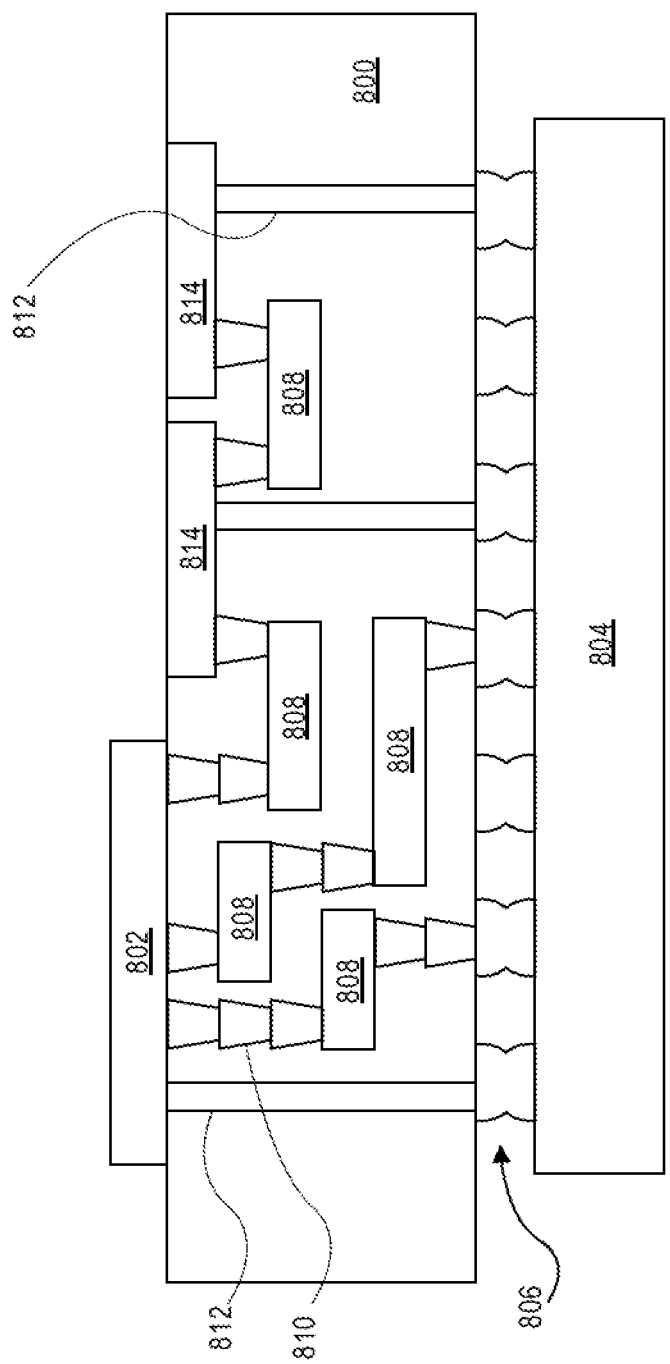
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may a memory array that comprises bitcells with a binary alloy phase change material as the storage element, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise a plurality of stacked components with a contact or via disposed in an isolation region adjacent to the stacked components, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a first channel, wherein the first channel comprises a semiconductor; a second channel positioned directly above the first channel, wherein the second channel comprises a semiconductor: a source/drain (S/D) region, wherein the S/D region electrically couples the first channel to the second channel; a first isolation region, wherein the first isolation region is parallel to a length direction of the first channel and the second channel; a second isolation region, wherein the second isolation region is substantially parallel to the first isolation region, and wherein the first channel and the second channel are between the first isolation region and the second isolation region; and a contact, wherein the contact is over a top surface of the S/D region and over a first sidewall surface of the S/D region.

Example 2: the semiconductor device of Example 1, wherein the first sidewall surface of the S/D region is substantially parallel to the length direction of the first channel.

Example 3: the semiconductor device of Example 2, wherein the contact is within the first isolation region.

Example 4: the semiconductor device of Examples 1-3, wherein the first sidewall surface of the S/D region is substantially orthogonal to the length direction of the first channel.

Example 5: the semiconductor device of Example 4, wherein the contact is within a depopulated gate region.

Example 6: the semiconductor device of Examples 1-5, wherein the contact extends over a second sidewall surface of the S/D region.

Example 7: the semiconductor device of Examples 1-6, wherein the contact extends over a bottom surface of the S/D region.

Example 8: the semiconductor device of Examples 1-7, further comprising: a second contact, wherein the second contact is over a bottom surface of the S/D region.

Example 9: the semiconductor device of Example 8, wherein the second contact is over a second sidewall surface of the S/D region that is opposite from the first sidewall surface of the S/D region.

Example 10: the semiconductor device of Examples 1-9, wherein the first channel and the second channel are a nanowire or a nanoribbon.

Example 11: the semiconductor device of Examples 1-10, wherein the first channel is a fin, a nanowire, or a nanoribbon, and wherein the second channel is a different one of the fin, the nanowire, or the nanoribbon.

Example 12: the semiconductor device of Examples 1-11, wherein the first channel and the second channel are included in a stack of a plurality of channels.

Example 13: the semiconductor device of Examples 1-12, wherein the first isolation region comprises: a first wall; a second wall; and a fill layer between the first wall and the second wall.

Example 14: the semiconductor device of Example 13, wherein a height of the first wall is less than a height of the second wall.

Example 15: a semiconductor device, comprising: a first stack, wherein the first stack comprises: a plurality of first components; and a first plurality of insulating layers, wherein the plurality of first components are electrically isolated from each other by the first plurality of insulating layers; an isolation region adjacent to the first stack, wherein the isolation region comprises: a first wall that contacts a sidewall of the first stack; a second wall that is parallel to the first wall; and a fill layer between the first wall and the second wall; and a via, wherein the via comprises: a first portion between the first wall and the second wall that extends in a vertical direction; and a second portion that extends away from the first portion, wherein the second portion passes through the first wall and contacts one of the plurality of first components.

Example 16: the semiconductor device of Example 15, wherein the via further comprises: a plurality of second portions that extend away from the first portion, wherein each second portion of the plurality of second portions contacts a different one of the plurality of first components.

Example 17: the semiconductor device of Example 15 or Example 16, wherein the via extends through an entire thickness of the fill layer.

Example 18: the semiconductor device of Examples 15-17, wherein the plurality of first components comprises one or more of a capacitor, an inductor, a transistor, and a diode.

Example 19: the semiconductor device of Examples 15-18, further comprising: a second stack adjacent to the second wall of the isolation region, wherein the second stack comprises: a plurality of second components; and a second plurality of insulating layers, wherein the plurality of second components are electrically isolated from each other by the second plurality of insulating layers.

Example 20: the semiconductor device of Example 19, wherein the via further comprises: a third portion that extends away from the first portion, wherein the third portion passes through the second wall and contacts one of the plurality of second components.

Example 21: the semiconductor device of Example 20, wherein the one of the plurality of second components is at a same Z-height as the one of the plurality of first components, or wherein the one of the plurality of second components is at a different Z-height as the one of the plurality of first components.

Example 22: the semiconductor device of Example 20, wherein the first stack of components is aligned along a first Y-Z plane and the second stack of component is aligned along a second Y-Z plane that is different than the first Y-Z plane.

Example 23: an electronic system, comprising: a board; a package substrate electrically coupled to the board; and a die electrically coupled to the package substrate, wherein the die comprises: a stack of components; and a via adjacent to the stack of components, wherein the via comprises a vertical portion and a horizontal portion.

Example 24: the electronic system of Example 23, wherein an insulating layer is disposed between each of the components in the stack of components, and wherein the horizontal portion of the via contacts one of the components in the stack of components.

Example 25: the electronic system of Example 23, wherein the stack of components are electrically coupled together by a common source/drain (S/D) region, and wherein the vertical portion of the via extends along a sidewall of the common S/D region, and wherein the horizontal portion of the via is over a top or bottom surface of the common S/D region.

Example 26: a method of forming a semiconductor device, comprising: providing a plurality of transistors stacked over each other, wherein a first isolation region is parallel to a first sidewall of the plurality of transistors and a second isolation region is parallel to a second sidewall of the plurality of transistors, wherein the first isolation region comprises: a first wall; a second wall that is parallel to the first wall; and a fill layer between the first wall and the second wall; recessing the fill layer in the first isolation region; removing a portion of the first wall to expose the first sidewall of the plurality of transistors; and disposing a conductive material into the first isolation region to form a contact, wherein the contact directly contacts the first sidewall of the plurality of transistors.

Example 27: the method of Example 26, wherein removing the portion of the first wall comprises: an angled etching process.

Example 28: the method of Example 26, wherein removing the portion of the first wall comprises: doping the first wall with an angled implantation process, wherein the doped first wall has an etch selectivity to the second wall; and selectively etching the first wall.

Example 29: the method of Examples 26-28, wherein removing the portion of the first wall comprises removing all portions of the first wall that are contacting the first sidewall.

Example 30: a method of forming a semiconductor device, comprising: providing a first stack and a second stack with an isolation region between the first stack and the second stack, wherein the first stack and the second stack each comprises a plurality of components alternating with insulating layers, and wherein the isolation region comprises a first wall, a second wall, and a fill layer between the first wall and the second wall; recessing the fill layer to expose sidewall surfaces of the first wall and the second wall; disposing a sacrificial layer over the fill layer; disposing a mask layer over the exposed sidewall surfaces of the first wall and the second wall; removing the sacrificial layer, wherein sidewall surfaces of the first wall and the second wall below the mask layer and above the fill layer are exposed; etching through the exposed sidewall surfaces of the first wall and the second wall; and disposing a conductive material into the isolation region to form a contact to a first component in the first stack and a second component in the second stack.

Example 31: the method of Example 30, wherein recessing the fill layer comprises: recessing the fill layer so that a top surface of the fill layer is below at least one component of the first stack and above at least one component of the first stack.

Example 32: the method of Example 30 or Example 31, further comprising: removing the mask layer after etching through the exposed sidewall surfaces of the first wall and the second wall.

Example 33: the method of Examples 30-32, wherein the plurality of components comprise one or more of a capacitor, an inductor, a transistor, and a diode.

What is claimed is:

1. A semiconductor device, comprising:
    a first stack, wherein the first stack comprises:
        a plurality of first components; and
        a first plurality of insulating layers, wherein the plurality of first components are electrically isolated from each other by the first plurality of insulating layers;
    an isolation region adjacent to the first stack, wherein the isolation region comprises:
        a first wall that contacts a sidewall of the first stack;
        a second wall that is parallel to the first wall; and
        a fill layer between the first wall and the second wall; and
    a via, wherein the via comprises:
        a first portion between the first wall and the second wall that extends in a vertical direction; and
        a second portion that extends away from the first portion, wherein the second portion passes through the first wall and contacts one of the plurality of first components.

2. The semiconductor device of claim 1, wherein the via further comprises:
    a plurality of second portions that extend away from the first portion, wherein each second portion of the plurality of second portions contacts a different one of the plurality of first components.

3. The semiconductor device of claim 1, wherein the via extends through an entire thickness of the fill layer.

4. The semiconductor device of claim 1, wherein the plurality of first components comprises one or more of a capacitor, an inductor, a transistor, and a diode.

5. The semiconductor device of claim 1, further comprising:
    a second stack adjacent to the second wall of the isolation region, wherein the second stack comprises:
        a plurality of second components; and
        a second plurality of insulating layers, wherein the plurality of second components are electrically isolated from each other by the second plurality of insulating layers.

6. The semiconductor device of claim 5, wherein the via further comprises:
    a third portion that extends away from the first portion, wherein the third portion passes through the second wall and contacts one of the plurality of second components.

7. The semiconductor device of claim 6, wherein the one of the plurality of second components is at a same Z-height as the one of the plurality of first components, or wherein the one of the plurality of second components is at a different Z-height as the one of the plurality of first components.

8. The semiconductor device of claim 6, wherein the first stack of components is aligned along a first Y-Z plane and the second stack of component is aligned along a second Y-Z plane that is different than the first Y-Z plane.

9. An electronic system, comprising:
    a board;
    a package substrate electrically coupled to the board; and
    a die electrically coupled to the package substrate, wherein the die comprises:
        a first stack, wherein the first stack comprises:
        a plurality of first components; and
        a first plurality of insulating layers, wherein the plurality of first components are electrically isolated from each other by the first plurality of insulating layers;
    an isolation region adjacent to the first stack, wherein the isolation region comprises:
        a first wall that contacts a sidewall of the first stack;
        a second wall that is parallel to the first wall; and
        a fill layer between the first wall and the second wall; and
    a via, wherein the via comprises:
        a first portion between the first wall and the second wall that extends in a vertical direction; and
        a second portion that extends away from the first portion, wherein the second portion passes through the first wall and contacts one of the plurality of first components.

10. The electronic system of claim 9, further comprising: a memory coupled to the board.

11. The electronic system of claim 9, further comprising: a communication chip coupled to the board.

12. The electronic system of claim 9, further comprising: a battery coupled to the board.

* * * * *